(12) United States Patent
Kotru et al.

(10) Patent No.: US 11,652,179 B2
(45) Date of Patent: May 16, 2023

(54) METHODS AND SYSTEMS FOR REAL TIME UV MONITORING FOR TRACKING AND MAINTAINING REQUIRED VITAMIN D DOSAGE

(71) Applicant: The Board of Trustees of The University of Alabama, Tuscaloosa, AL (US)

(72) Inventors: Sushma Kotru, Tuscaloosa, AL (US); Vaishali Batra, Tuscaloosa, AL (US)

(73) Assignee: The Board of Trustees of The University of Alabama, Tuscaloosa, AL (US)

( * ) Notice: Subject to any disclaimer, the term of this patent is extended or adjusted under 35 U.S.C. 154(b) by 100 days.

(21) Appl. No.: 17/151,781

(22) Filed: Jan. 19, 2021

(65) Prior Publication Data
US 2021/0242355 A1    Aug. 5, 2021

Related U.S. Application Data

(62) Division of application No. 15/957,340, filed on Apr. 19, 2018, now Pat. No. 10,957,807.
(Continued)

(51) Int. Cl.
*G01J 5/34*      (2022.01)
*H01L 31/032*    (2006.01)
(Continued)

(52) U.S. Cl.
CPC .......... *H01L 31/032* (2013.01); *G01J 1/0219* (2013.01); *G01J 1/429* (2013.01);
(Continued)

(58) Field of Classification Search
CPC .......... H01L 31/032; H01L 31/022475; H01L 31/0465; H01L 31/09; H01L 31/108;
(Continued)

(56) References Cited

U.S. PATENT DOCUMENTS 4,135,224 A * 1/1979 Maher .................. H01G 4/1245
                                              29/25.42
4,365,106 A * 12/1982 Pulvari .................. H01L 37/02
                                              136/254
(Continued)

FOREIGN PATENT DOCUMENTS

| EP | 2568266 | 3/2013 | |
|---|---|---|---|
| EP | 2175497 B1 * | 11/2019 | ......... H01L 27/1443 |
| WO | 2015051013 | 4/2015 | |

OTHER PUBLICATIONS

Anoop, et al., "Ultra-thin platinum interfacial layer assisted-photovoltaic response of transparent Pb(Zr,Ti)O3 thin film capacitors", Energy 111, 118 (2015).
(Continued)

*Primary Examiner* — David P Porta
*Assistant Examiner* — Djura Malevic
(74) *Attorney, Agent, or Firm* — Meunier Carlin & Curfman LLC

(57) ABSTRACT

Embodiments disclosed herein facilitates the monitoring of direct ultraviolet B (UVB) radiation exposure by a person via a system having a sensor (such as Lanthanum doped lead zirconate titanate (PLZT) thin-film sensors or other ferroelectric-based sensors) sensitive to UVB radiation. The system beneficially provides current real-time dosage information associated with Vitamin D production by the person as well as real-time indication of safe exposure and/or harmful exposure to current UVB radiation conditions while also, in some embodiments, takes into consideration a person's age, skin type and sensitivity, body surface area exposed.

21 Claims, 26 Drawing Sheets

Related U.S. Application Data

(60) Provisional application No. 62/599,434, filed on Dec. 15, 2017, provisional application No. 62/487,188, filed on Apr. 19, 2017.

(51) Int. Cl.
| | |
|---|---|
| *H01L 31/0465* | (2014.01) |
| *H01L 31/09* | (2006.01) |
| *G01J 1/44* | (2006.01) |
| *G01J 1/42* | (2006.01) |
| *H01L 31/108* | (2006.01) |
| *H01L 31/109* | (2006.01) |
| *G01J 5/10* | (2006.01) |
| *G01J 5/04* | (2006.01) |
| *H01L 31/0224* | (2006.01) |
| *G01J 1/02* | (2006.01) |

(52) U.S. Cl.
CPC ............. *G01J 1/44* (2013.01); *G01J 5/046* (2013.01); *G01J 5/10* (2013.01); *G01J 5/34* (2013.01); *H01L 31/022475* (2013.01); *H01L 31/0465* (2014.12); *H01L 31/09* (2013.01); *H01L 31/108* (2013.01); *H01L 31/109* (2013.01); *G01J 1/0238* (2013.01); *G01J 2001/0257* (2013.01); *G01J 2001/4266* (2013.01); *G01J 2001/446* (2013.01); *Y02E 10/50* (2013.01)

(58) Field of Classification Search
CPC ....... H01L 31/109; G01J 1/0219; G01J 1/429; G01J 1/44; G01J 5/046; G01J 5/10; G01J 5/34; G01J 1/0238; G01J 2001/0257; G01J 2001/4266; G01J 2001/446
See application file for complete search history.

(56) References Cited

U.S. PATENT DOCUMENTS

| | | | | | |
|---|---|---|---|---|---|
| 5,206,829 | A * | 4/1993 | Thakoor | ........... | H01L 27/11502 257/E27.104 |
| 5,364,710 | A * | 11/1994 | Hikita | ............... | H02S 99/00 257/431 |
| 5,793,076 | A * | 8/1998 | Fazan | ............... | H01L 28/55 257/532 |
| 6,172,385 | B1 * | 1/2001 | Duncombe | ............ | H01L 28/56 257/295 |
| 6,211,034 | B1 * | 4/2001 | Visokay | ........... | H01L 21/32139 438/720 |
| 6,521,511 | B1 * | 2/2003 | Inoue | ............... | H01L 21/2007 438/455 |
| 7,227,153 | B2 * | 6/2007 | Yagi | ............... | G01J 1/429 250/372 |
| 7,265,358 | B2 * | 9/2007 | Fontaine | .............. | A42B 1/0182 250/365 |
| 7,387,913 | B2 * | 6/2008 | Yoshimura | ........ | H04Q 11/0005 257/E33.056 |
| 7,432,577 | B1 * | 10/2008 | Weiss | ............... | H01L 31/108 257/E31.026 |
| 7,557,367 | B2 * | 7/2009 | Rogers | ............. | H01L 21/02603 257/40 |
| 7,732,770 | B2 * | 6/2010 | Han | ............... | G01J 5/024 250/338.3 |
| 7,851,697 | B2 * | 12/2010 | Yao | ............... | H02S 99/00 136/258 |
| 7,929,272 | B2 * | 4/2011 | Kakei | ............... | H01G 4/005 361/321.1 |
| 7,960,774 | B2 * | 6/2011 | Choi | ............... | H01G 7/06 257/E21.679 |
| 8,064,188 | B2 * | 11/2011 | Oakes | ............... | H01Q 1/1242 361/306.1 |
| 8,345,461 | B2 * | 1/2013 | Nawano | ........... | H01G 4/33 257/295 |
| 8,586,938 | B2 * | 11/2013 | Tsubata | ........... | G04G 21/02 250/372 |
| 8,603,849 | B2 * | 12/2013 | Kim | ........... | H01L 31/18 438/57 |
| RE44,998 | E * | 7/2014 | Oakes | ........... | H01Q 21/065 361/306.1 |
| 8,981,213 | B1 * | 3/2015 | Micallef | ........... | H01G 9/2068 136/263 |
| 9,230,739 | B2 * | 1/2016 | Fairchild | ........... | H01G 4/30 |
| 9,299,496 | B2 * | 3/2016 | Fairchild | ........... | H01G 4/306 |
| 9,383,255 | B2 * | 7/2016 | Lian | ........... | G01J 1/0219 |
| 9,383,256 | B2 * | 7/2016 | Lian | ........... | G01J 1/44 |
| 9,470,577 | B2 * | 10/2016 | Lian | ........... | G06F 1/163 |
| 9,551,611 | B2 * | 1/2017 | Oliver | ........... | G01J 1/0219 |
| 9,707,243 | B2 * | 7/2017 | Ali | ........... | A61K 36/53 |
| 9,753,182 | B1 * | 9/2017 | Bennouri | ........... | G01J 1/0219 |
| 9,778,099 | B2 * | 10/2017 | Allen | ........... | G01J 1/08 |
| 9,823,120 | B2 * | 11/2017 | Lian | ........... | G01J 1/429 |
| 9,876,018 | B2 * | 1/2018 | Chavan | ........... | H01L 27/1159 |
| 9,880,052 | B2 * | 1/2018 | Dumont | ........... | G06F 1/3287 |
| 9,908,817 | B2 * | 3/2018 | Ma | ........... | C04B 35/624 |
| 9,963,271 | B2 * | 5/2018 | Richter | ........... | G01J 1/50 |
| 9,983,054 | B2 * | 5/2018 | Zhang | ........... | G01J 1/44 |
| 10,052,396 | B2 * | 8/2018 | Salter | ........... | A61N 5/0613 |
| 10,060,787 | B2 * | 8/2018 | Balooch | ........... | G01J 1/50 |
| 10,072,975 | B2 * | 9/2018 | Sood | ........... | G01J 1/0233 |
| 10,132,680 | B1 * | 11/2018 | Isikman | ........... | G01J 1/18 |
| 10,247,603 | B2 * | 4/2019 | Hatta | ........... | G01J 1/50 |
| 10,323,979 | B2 * | 6/2019 | Park | ........... | H01L 31/1085 |
| 10,365,156 | B2 * | 7/2019 | Gonzalez | ........... | G01J 1/0219 |
| 10,436,914 | B2 * | 10/2019 | Gindraux | ........... | G01T 1/02 |
| 10,463,133 | B2 * | 11/2019 | Sun | ........... | G01J 1/429 |
| 10,485,085 | B2 * | 11/2019 | Nara | ........... | G02B 5/208 |
| 10,527,490 | B2 * | 1/2020 | Dumont | ........... | G06F 1/1632 |
| 10,561,376 | B1 * | 2/2020 | Kahn | ........... | G01J 1/429 |
| 10,648,858 | B2 * | 5/2020 | Lian | ........... | G01J 1/44 |
| 10,823,608 | B2 * | 11/2020 | Wei | ........... | G01J 1/429 |
| 10,922,397 | B2 * | 2/2021 | Toumazou | ........... | G06F 1/163 |
| 10,939,025 | B2 * | 3/2021 | Hu | ........... | G01J 1/4228 |
| 10,957,807 | B2 * | 3/2021 | Kotru | ........... | G01J 1/44 |
| 11,054,530 | B2 * | 7/2021 | Menge | ........... | G07D 7/1205 |
| 11,118,968 | B1 * | 9/2021 | Lian | ........... | G01T 1/02 |
| 2003/0071300 | A1 * | 4/2003 | Yashima | ........... | H01L 28/55 257/E21.009 |
| 2003/0224612 | A1 * | 12/2003 | Merrett | ........... | H01L 29/0615 257/E21.058 |
| 2004/0070015 | A1 | 4/2004 | Lung | | |
| 2004/0247236 | A1 * | 12/2004 | Yoshimura | ........... | G02B 6/43 385/16 |
| 2005/0098205 | A1 * | 5/2005 | Roscheisen | ........ | H01L 31/03529 257/E31.032 |
| 2005/0115673 | A1 * | 6/2005 | Samukawa | ........... | H01L 22/34 156/345.28 |
| 2006/0011904 | A1 * | 1/2006 | Snyder | ........... | B82Y 20/00 257/17 |
| 2006/0042680 | A1 * | 3/2006 | Korman | ........... | H01L 31/048 136/251 |
| 2006/0261432 | A1 * | 11/2006 | Yoshimura | ........... | G02B 6/43 257/E31.127 |
| 2007/0109716 | A1 * | 5/2007 | Martin | ........... | H01G 4/228 361/303 |
| 2008/0010798 | A1 * | 1/2008 | Borland | ........... | H01G 4/1218 29/25.42 |
| 2008/0048181 | A1 * | 2/2008 | Tanaka | ........... | H01L 51/0068 526/256 |
| 2008/0068143 | A1 * | 3/2008 | Sugiura | ........... | G01J 1/429 340/552 |
| 2008/0092953 | A1 * | 4/2008 | Lee | ........... | B82Y 10/00 136/252 |
| 2008/0315100 | A1 * | 12/2008 | Han | ........... | G01J 5/046 250/338.3 |
| 2010/0096559 | A1 * | 4/2010 | Yao | ........... | H01L 31/09 250/372 |
| 2010/0277040 | A1 * | 11/2010 | Klee | ........... | H01L 41/053 29/25.35 |

(56) References Cited

U.S. PATENT DOCUMENTS

| | | | |
|---|---|---|---|
| 2011/0146774 A1* | 6/2011 | Kim | H01L 31/035272 438/94 |
| 2011/0222375 A1* | 9/2011 | Tsubata | G04G 21/02 368/11 |
| 2012/0118368 A1* | 5/2012 | Huang | H01L 51/4246 257/E51.026 |
| 2012/0154975 A1* | 6/2012 | Oakes | H01G 4/38 361/301.4 |
| 2012/0322164 A1* | 12/2012 | Lal | H01L 31/068 374/E11.018 |
| 2012/0326046 A1* | 12/2012 | Aslam | G01J 1/429 250/214 DC |
| 2013/0026382 A1* | 1/2013 | Yao | H01L 31/108 257/431 |
| 2013/0037809 A1* | 2/2013 | Nakamura | H01L 51/102 257/E29.273 |
| 2014/0034815 A1* | 2/2014 | Lai | G01J 1/46 250/214 SW |
| 2014/0093148 A1 | 4/2014 | Williams | |
| 2014/0127649 A1* | 5/2014 | Utter, II | G16H 20/60 434/127 |
| 2014/0290734 A1* | 10/2014 | Hosono | H02S 99/00 136/256 |
| 2014/0319317 A1* | 10/2014 | Lai | H01L 49/00 250/200 |
| 2014/0323968 A1* | 10/2014 | Rogers | H05K 1/0275 29/829 |
| 2015/0041663 A1* | 2/2015 | Oliver | G01W 1/00 250/372 |
| 2015/0102208 A1* | 4/2015 | Appelboom | G01J 1/4204 250/208.2 |
| 2015/0122018 A1 | 5/2015 | Yuen | |
| 2015/0177055 A1* | 6/2015 | Lian | G06F 1/163 250/372 |
| 2015/0177059 A1* | 6/2015 | Lian | G06F 1/163 702/19 |
| 2015/0177063 A1* | 6/2015 | Lian | G06F 1/163 250/372 |
| 2015/0373831 A1* | 12/2015 | Rogers | H01M 50/502 29/829 |
| 2016/0035914 A1* | 2/2016 | Deliwala | G02B 5/28 438/70 |
| 2016/0041035 A1* | 2/2016 | Allen | G01J 1/0266 356/402 |
| 2017/0040473 A1* | 2/2017 | Chen | H01L 31/032 |
| 2017/0069192 A1* | 3/2017 | Sood | H04M 1/72454 |
| 2017/0191866 A1* | 7/2017 | Balooch | G01J 1/029 |
| 2018/0015192 A1* | 1/2018 | Salter | A61N 5/0613 |
| 2018/0136038 A1* | 5/2018 | Lian | A61B 5/441 |
| 2018/0172506 A1* | 6/2018 | Park | H01L 31/0392 |
| 2018/0308997 A1* | 10/2018 | Kotru | H01L 31/0465 |
| 2018/0353770 A1* | 12/2018 | Moffat | A61N 5/0616 |
| 2019/0017866 A1* | 1/2019 | Sood | G01J 1/429 |
| 2019/0204146 A1* | 7/2019 | Wei | G01J 1/0219 |
| 2019/0316960 A1* | 10/2019 | Gonzalez | G01J 1/0233 |
| 2020/0112659 A1* | 4/2020 | Hu | G01J 1/0271 |
| 2020/0143027 A1* | 5/2020 | Toumazou | A61B 5/6802 |
| 2020/0368559 A1* | 11/2020 | Poutiatine | A61B 5/442 |
| 2021/0398669 A1* | 12/2021 | Kosecoff | G16H 20/70 |
| 2022/0028564 A1* | 1/2022 | Kosecoff | G01J 1/0219 |
| 2022/0083638 A1* | 3/2022 | Toumazou | H04W 4/80 |
| 2022/0178744 A1* | 6/2022 | Kosecoff | G01J 1/58 |
| 2022/0179308 A1* | 6/2022 | Okade | G03F 7/004 |

OTHER PUBLICATIONS

Batra, Vaishali et al., "Optical constants and band gap determination of Pb0.95 La0.05 Zr0.54 Ti0.46 O3 thin films using spectroscopic ellipsometry and UV-visible spectroscopy," Optical Materials 49, pp. 123-128 (2015).

Chen, et al., "Effect of top electrodes on photovoltaic properties of polycrystalline BiFeO3 based thin film capacitors.", Nanotechnol. 22, 195201 (2011).

Cheuk, et al., "Delivery of personal ultraviolet radiation information to smartphones", NIWA UV Workshop, Auckland, Apr. 15-17, 2 pages (2014).

Daniel de Godoy, et al., "RIO-40C: A Low-Cost Wearable Sunlight Exposure Monitor for Skincare: Demo Abstract", Published 2017 in IoTDI DOI:10.1145/3054977.3057319.

Dr. Mercola, "The World's Single Deadliest Vitamin Deficiency" accessed on-line http://www.mercola.com/Downloads/bonus/vitamin-d/report.aspx 13 pages.

Engelsen, "The Relationship between Ultraviolet Radiation Exposure and Vitamin D Status," Nutrients vol. 2(5), pp. 482-495 (2010).

Webb, et al., "Ultraviolet exposure scenarios: risks of erythema from recommendations on cutaneous vitamin D synthesis," Adv. Exp. Med. Biol. vol. 624, pp. 72-85 (2008).

Harshan Nampoori, "Pb0.95La0. 05Zr0. 54Ti0. 46O3 Thin Films for Photovoltaic Applications," arXiv preprint arXiv:1304.1611 (2013).

Harshan Nampoori, et al., "Effect of Annealing on Ferroelectric Properties of Lanthanum Modified Lead Zirconate Titanate Thin Films," Integrated Ferroelectrics, vol. 130, pp. 73-83 (2011).

Harshan Nampoori, et al., "Evaluation of indium tin oxide films grown at room temperature by pulsed electron deposition", J. Vac. Sci. Technol. A 28, 671 (2010).

Harshan Nampoori, et al., "Influence of work-function of top electrodes on the photovoltaic characteristics of Pb0.95La0.05Zr0. 54Ti0.46O3 thin film capacitors", Applied Physics Letters 100. 173901 (2012).

Harshan Nampoori, et al., "Photovoltaic and Ferroelectric Properties of Pb0. 95La0. 05Zr0. 54Ti0. 46O3 Thin Films under Dark and Illuminated Conditions," Ferroelectrics 470.1, pp. 99-106 (2014).

Hussain, et al., "Promoting UV Exposure Awareness with Persuasive, Wearable Technologies", Stud Health Technol Inform. 227:48-54 (2016).

Ichiki, et al., "Photovoltaic effect of lead lanthanum zirconate titanate in a layered film structure design", Appl. Phys. Lett. 84, 395 (2004).

Ichiki, et al., "Photovoltaic properties of lead lanthanum zirconate titanate ceramics in a layered film structure design", Ceramics International 30(7): 1831-1834 (2004).

Ichiki, et al., "Preparation and Photovoltaic Properties of Lead Lanthanum Zirconate Titanate in Design of Multilayers", Japanese Journal of Applied Physics vol. 44, No. 9B, pp. 6927-6933 (2005).

Lai, et al., "A Photovoltaic UV Sensor Wwith a Ferroelectric Thin Film on Transparent Substrate", IEEE Electron Device Letters, 34(11): 1427-1429 (2013).

Ma, et al., "Chemical solution deposition of ferroelectric lead lanthanum zirconate titanate films on base-metal foils", J Electroceram 22: 383-389 (2009).

Naeem, "Vitamin D Deficiency—An Ignored Epidemic", Inter. J. Health Sciences (Qassim), vol. 4 (2010), p. V-VI.

Nair, et al., Vitamin D: "The Sunshine" vitamin, J. Pharmacol Pharmacother, vol. 3 (2012), p. 118-126.

Ponsonby, et al., UVR, vitamin D and three autoimmune diseases multiple sclerosis, type 1 diabetes, rheumatoid arthritis. Photochem. Photobiol., vol. 81, 1267-1275 (2005).

Tong, et al., "Lead Lanthanum Zirconate Titanate Ceramic Thin Films for Energy Storage", ACS Appl. Mater. Interfaces, 5 (4), pp. 1474-1480 (2013).

Uchino, et al., "High-Voltage Photovoltaic Effect in PbTiO3-Based Ceramics", Japanese Journal of Applied Physics, vol. 21, Issue 12, pp. 1671 (1982).

Yoa, et al., "Large photo-induced voltage in a ferroelectric thin film with in-plane polarization", Appl. Phys. Lett. 87, 212906 (2005).

Zhang, et al., "Enlarging photovoltaic effect: combination of classic photoelectric and ferroelectric photovoltaic effects", Scientific Reports 3: 2109 (2013).

Zhang, et al., "See UV on your skin: an ultraviolet sensing and visualization system", BodyNets '13 Proceedings of the 8th International Conference on Body Area Networks, 22-28, (2013).

(56) References Cited

OTHER PUBLICATIONS

Jian Zhong, Effect of Pb content and solution concentration of Pb(x)TiO(3) seed Tayer on {100}-texture and ferroelectric/dielectric behavior of PZT (52/48) thin films, J. Vac. Sci. Technol. A 33, 05E119 (2015).

* cited by examiner

| Voltage [V] | Binary representation | UV Index | |
|---|---|---|---|
| 0-0.625 | 000 | 0-2.9 | } 1902 |
| 0.6251-1.25 | 001 | 3-5.9 | } 1904 |
| 1.251-1.87 | 010 | 6-7.9 | } 1906 |
| 1.871-2.5 | 011 | 6-7.9 | |
| 2.51-3.12 | 100 | 8-10.9 | } 1908 |
| 3.121-3.75 | 101 | 11+ | } 1910 |
| 3.751-4.37 | 110 | 11+ | |
| 4.371-5.00 | 111 | 11+ | |

*FIG. 19*

| Age | Vitamin D requirements | |
|---|---|---|
| | Males IU/day (mcg) | Females IU/day (mcg) |
| 0-6 months | 400 (10) | 400 (10) |
| 6-12 months | 600 (15) | 600 (15) |
| 1-18 years | 600 (15) | 600 (15) |
| 19-50 years | 600 (15) | 600 (15) |
| 51-70 years | 600 (15) | 600 (15) |
| 70+ years | 800 (20) | 800 (20) |
| Pregnant (all ages) | -- | >600 (15) |
| Breast feeding mothers (all ages) | -- | >600 (15) |

FIG. 23

| Exposed body area | Percentage of exposed body area (%) | Skin type 2 | | | | Skin type 5 | | | |
|---|---|---|---|---|---|---|---|---|---|
| | | 400 IU/day | | 1000 IU/day | | 400 IU/day | | 1000 IU/day | |
| | | ET (sec) | MED (J/m²) | ET (sec) | MED (J/m²) | ET (sec) | MED (J/m²) | ET (sec) | MED (J/m²) |
| Face, Neck, Hands | 11.5 | 540 | 0.21 | 1296 | 0.54 | 1260 | 0.21 | 3204 | 0.54 |
| Face, Neck, Hands, Arms | 25.5 | 252 | 0.09 | 612 | 0.24 | 570 | 0.09 | 1440 | 0.24 |
| Face, Neck, Hands, Arms, Legs | 57.5 | 108 | 0.04 | 252 | 0.10 | 252 | 0.04 | 648 | 0.10 |

| Skin Type | Sensitivity level |
|---|---|
| Very fair (1) | 5 |
| Fair (2) | 4 |
| Light Brown (3) | 3 |
| Moderate Brown (4) | 2 |
| Dark Brown (5) | 1 |
| Black (6) | 1 |

| Intensity (mW/cm²) | Exposure time | UV Dosage (mWs/cm²) | UV Dosage (J/cm²) |
|---|---|---|---|
| 2 | 2 min (2*60 =120 sec) | 2*120 =240 | 0.24 |
| 2 | 3 min (3*60 =180 sec) | 360 | 0.36 |
| 10 | 1 min (1*60=60 sec) | 600 | 0.6 |
| 12 | 1 min (1*60=60 sec) | 720 | 0.72 |
| 12 | 30 sec | 360 | 0.36 |
| 15 | 60 sec | 900 | 0.90 |
| 20 | 30 sec | 600 | 0.60 |

FIG. 25

METHODS AND SYSTEMS FOR REAL TIME UV MONITORING FOR TRACKING AND MAINTAINING REQUIRED VITAMIN D DOSAGE

CROSS REFERENCE TO RELATED APPLICATIONS

This is a divisional application of U.S. patent application Ser. No. 15/957,340, filed Apr. 19, 2018, entitled "PLZT THIN FILM CAPACITORS APPARATUS WITH ENHANCED PHOTOCURRENT AND POWER CONVERSION EFFICIENCY AND METHOD THEREOF," which claims priority to, and the benefit of, U.S. Provisional Application No. 62/487,188, filed Apr. 19, 2017, titled "PLZT THIN FILM CAPACITORS APPARATUS WITH ENHANCED PHOTOCURRENT AND POWER CONVERSION EFFICIENCY AND METHOD THEREOF" and U.S. Provisional Application No. 62/599,434, filed Dec. 15, 2017, titled "METHODS AND SYSTEMS FOR REAL TIME UV MONITORING FOR TRACKING AND MAINTAINING REQUIRED VITAMIN D DOSAGE," each of which is incorporated by reference herein in its entirety.

This invention was made with government support under EECS 943711 awarded by the National Science Foundation. The government has certain rights in the invention.

TECHNICAL FIELD

The disclosure generally relates a material system, and structure thereof, for a sensor or photovoltaic device, in particular, a ferroelectric thin film such as a lanthanum-doped lead zirconate titanate (PLZT) thin-film-based system. Further, the disclosure also relates to the use of such sensors, among others, e.g., for energy generation or for sensors. The disclosure real-time further relates to the monitoring of ultraviolet radiation exposure for health care applications, in particular ultraviolet B radiation, to track Vitamin D dosage.

BACKGROUND

Photosensitive materials which are sensitive to light (e.g., sunlight) are known to exhibit a current when exposed to sunlight. When exposed to light (e.g., photons), these photosensitive materials generate charge carriers which can be collected at respective electrodes giving rise to photocurrent and photovoltage. When these photosensitive materials are used, in a capacitor structure, to harvest energy to generate electricity, they may be considered as a photovoltaic (PV) device. However, magnitude of the resulting photocurrent and photovoltage are often very small, thereby making such photosensitive materials yet unsuitable for device applications. Many materials (oxides as well as metals) can be used as bottom and top electrodes to make capacitors from such films. Choice of bottom and top electrodes can affect the maximum electrical output from the capacitor structure derived therefrom.

Considering the rising demand for power, ferroelectric thin films provides an alternate material for use in solar technology (which currently uses semiconductor materials (e.g. Si, GaAs, CdTe), organic materials, and perovskite) if they can provide comparable photocurrent output and power conversion efficiency to such materials. Power conversion efficiency generally relates to the conversion of sunlight energy to usable electrical or thermal energy.

Ferroelectric material typically exhibits spontaneous electric polarization in absence of an electrical field. Such polarization properties induce an in-built electric field that enables the separation of photo-generated charge carriers. To this end, PV effects in ferroelectric materials can be realized without a p-n junction, as is the case in other semiconductor-based devices.

What are needed are devices, systems, and methods that can address such limitations, among others.

SUMMARY

The exemplified systems, and method thereof, includes a ferroelectric thin film such as a PLZT thin film ($Pb_{0.95}La_{0.05}Zr_{0.54}Ti_{0.46}O_3$) paired with a bottom metal and top transparent conductive oxide, that forms a capacitor structure with enhanced photocurrent and power conversion efficiency. The exemplified systems use metal electrode (platinum) as bottom electrode and a transparent oxide (Indium Tin Oxide—ITO) as the top electrode. Platinum as an electrode material facilitates ease of integration with the silicon technology. Indium tin oxide (ITO) is an established material and used in semiconductor process industry that provides high reliability and robustness in the process environment along with transparency, high electrical conductivity, and price. Combination of these two materials as electrodes along with a ferroelectric thin film such as (e.g., the $Pb_{0.95}La_{0.5}Zr_{0.54}Ti_{0.46}O_3$ (PLZT) thin film) demonstrated enhanced photocurrent and power conversion efficiency of a resulting capacitor structure formed therewith. Remarkably, when exposed to light, a device with this structure is observed to provide higher absorption of light, in particular, sunlight, and to exhibit high photocurrent, increased power efficiency, and higher output yield, as compared to material system of similar topology.

The exemplified device may be used as an ultraviolet (UV) sensor.

In some embodiments, embodiments of the present invention facilitates the monitoring of direct ultraviolet B (UVB) radiation exposure by a person via a system having a sensor (such as Lanthanum doped lead zirconate titanate (PLZT) thin-film sensors or other ferroelectric-based sensors) sensitive to UVB radiation. The system beneficially provides current real-time dosage information associated with Vitamin D production by the person as well as real-time indication of safe exposure and/or harmful exposure to current UVB radiation conditions.

In an aspect, apparatus (e.g., solar cell, a UV sensor, a UV index sensor, etc.) is disclosed. The apparatus includes a substrate; a bottom layer coupled to the substrate, the bottom layer forming an electrode that comprises a material that includes, in part, platinum (or $LaNiO_3LaAlO_3$, LSMO, LSCO, $RuO_x$, $Nb:SrTiO_3$, or ITO); a thin film layer coupled to the bottom layer, the thin film layer substantially spanning the bottom layer and comprising a lanthanum-doped lead zirconate titanate (PLZT) thin-film material (e.g., $Pb_{0.95}La_{0.5}Zr_{0.54}Ti_{0.46}O_3$); and an array of top electrodes that collectively form a top layer over the thin film layer so as to form a plurality of capacitors (e.g., with the bottom layer) (e.g., wherein a first top electrode of the array forms a capacitor with a second top electrode of the array), each of the top electrodes comprising a transparent oxide (e.g., indium tin oxide) layer.

In some embodiments, the lanthanum-doped lead zirconate titanate thin-film material comprises $Pb_{0.95}La_{0.5}Zr_{0.54}Ti_{0.46}O_3$.

In some embodiments, the apparatus includes a seed layer comprising a material selected from the group consisting of $Pb_xTiO_3$, where x=1.0, 1.05, 1.1, or 1.2; PbO; $PbZrO_3$; $LaNiO_3$, $TiO_x$ where x≤2; $SrTiO_3$; $SrRuO_3$; $LaxSr_{1-x}CoO_3$, where 0<x<1; and $LaxSr_{1-x}MnO_3$ where 0<x<1.

In some embodiments, the bottom layer comprises a material selected from the metal group consisting of Au, Pt, and a combination thereof. In some embodiments, the bottom layer comprises a material selected from an oxide group consisting of $LaNiO_3LaAlO_3$, LSMO, LSCO, $RuO_x$, Nb:SrTiO_3, ITO, and a combination thereof. In some embodiments, the bottom layer comprises a composite selected from the metal consisting of Au, Pt, and a combination thereof and an oxide group consisting of $LaNiO_3LaAlO_3$, LSMO, LSCO, $RuO_x$, $Nb:SrTiO_3$, ITO, and a combination thereof.

In some embodiments, the substrate comprises a material selected from the group consisting $TiO_2$, $SiO_2$, Si, and a combination thereof.

In some embodiments, each formed capacitor of the plurality of capacitors has a light-to-electricity conversion efficiency of at least 0.05%.

In some embodiments, each formed capacitor of the plurality of capacitors has a photocurrent density $J_{sc}$ of at least $-6.8 \times 10^{-5}$ $A/cm^2$ (Amp per $cm^2$).

In some embodiments, the thin film layer comprises a ferroelectric thin film material.

In some embodiments, two or more electrodes of the array are electrically linked by a connection member (e.g., in series, parallel, or combination thereof), the two or more electrodes forming a capacitor with a portion of the bottom layer across a portion of the thin film layer.

In some embodiments, two or more electrodes of the array are electrically linked by a connection member (e.g., in series, in parallel, or in combination thereof), the two or more electrodes forming a capacitor with another electrode of the array.

In some embodiments, the array of top electrodes comprises a plurality of structures that form gaps thereamong so as to form the plurality of capacitors, wherein the plurality of capacitors include a first top electrode of the array that forms a capacitor with a second top electrode of the array.

In some embodiments, each formed capacitor of the plurality of capacitors has an operational spectral wavelength range that, at least, spans a range consisting of between about 315 nm and about 400 nm, between about 280 nm and about 315 nm, and between about between 200-800 nm.

In some embodiments, the thin film layer has a peak photocurrent value about 350 nm.

In some embodiments, each of formed capacitor of the plurality of capacitors forms a solar cell.

In some embodiments, each of the formed capacitor of the plurality of capacitors forms an ultraviolet sensor.

In some embodiments, the thin film layer is configured as a sensing layer for the ultraviolet sensor.

In another aspect, an ultraviolet-light indexing device is disclosed comprising: a display; a sensing element; and electronic circuitry. The sensing element is configured to respond to UV radiation, the sensing element comprising: a substrate; a bottom layer coupled to the substrate, the bottom layer forming an electrode that comprises a material that includes, in part, platinum; a thin film layer coupled to the bottom layer, the thin film layer substantially spanning the bottom layer and comprising a ferroelectric thin film such as a lanthanum-doped lead zirconate titanate thin-film material (e.g., $Pb_{0.95}La_{0.5}Zr_{0.54}Ti_{0.46}O_3$); and, a top electrode of an array of top electrodes that collectively form a top layer over the thin film layer so as to form a plurality of capacitors with the bottom layer, each of the top electrodes comprising a transparent oxide (e.g., indium tin oxide) layer. The electronic circuitry is coupled to an output of the sensing element to receive an electric output (e.g., a current output), or a signal derived therefrom, generated from the sensing element in response to exposure of the sensing element by the UV radiation, the electronic circuitry being coupled to the display and configured to present an index parameter (e.g., an UV index parameter) generated from with the electric output.

In some embodiments, the device is wearable (e.g., comprises a wrist strap, an attachable pin, a chain (e.g., as a necklace), a bracelet, or an anklet).

In some embodiments, the device is embedded in an article of clothing (e.g., a shirt, a hat, sunglasses, or spectacles).

In some embodiments, the device includes a wireless transceiver, the wireless transceiver being coupled to the electronic circuitry and being configured to transmit to generated index parameter to a computing device.

In some embodiments, the device includes a processor; and a memory, the memory having instructions stored thereon, wherein execution of the instructions, cause the processor to: calculate (via a transfer function) an index parameter from a parameter derived (e.g., via ADC stage and/or filtering stage) from the electric output.

In some embodiments, the instructions, when executed by the processor, further cause the processor to, cause presentation of the index parameter.

In some embodiments, the instructions, when executed by the processor, further cause the processor to cause presentation of one of a plurality of pre-defined messages, each of the plurality of pre-defined messages being associated with a corresponding UV index tier to which the index parameter is compared (e.g., tiers may include low, moderate, high, very high, and extreme).

In some embodiments, the instructions, when executed by the processor, further cause the processor to cause presentation of one of a plurality of pre-defined messages, each of the plurality of pre-defined messages being associated with an amount of sun protection (e.g., use of sunscreen, rating of sunscreen, use of hat, use of shirt, and etc.).

In some embodiments, the instructions, when executed by the processor, further cause the processor to cause presentation of one of a plurality of pre-defined messages including a first message directed to presence, or degree of, UV-A, and a second message directed to presence, or degree, of UV-B.

In some embodiments, the sensing element has an operation range between about 315 to about 400 nm and between about 280 nm to about 315 nm.

In some embodiments, the instructions, when executed by the processor, further cause the processor to monitor the sensing element and to cause a reminder message (e.g., visual, audio, and etc.) (e.g., via the device) to be presented to the user (e.g., a remaining time for safe exposure or an action, e.g., to seek shading or more protection, and etc.).

In some embodiments, the instructions, when executed by the processor, further cause the processor to monitor the sensing element and to cause a reminder message (e.g., visual, audio, and etc.) (e.g., via SMS message or email) to be transmitted to the user (e.g., a remaining time for safe exposure or an action, e.g., to seek shading or more protection, and etc.).

In some embodiments, the electronic circuitry comprises: an amplifier circuit; an analog-to-digital conversion circuit;

a processor; and, a memory, the memory having instructions stored thereon, wherein execution of the instructions, cause the processor to calculate (via a transfer function) an index parameter from a parameter derived, via the analog-to-digital convert circuit; from the electric output.

In another aspect, a method is disclosed of generating electric energy. The method includes exposing a solar cell to electromagnetic radiation in which the solar cell comprises: a substrate; a bottom layer coupled to the substrate, the bottom layer forming an electrode that comprises a material that includes, in part, platinum; a thin film layer coupled to the bottom layer, the thin film layer substantially spanning the bottom layer and comprising a ferroelectric thin film such as a lanthanum-doped lead zirconate titanate thin-film material (e.g., $Pb_{0.95}La_{0.05}Zr_{0.54}Ti_{0.46}O_3$); and, a top electrode of an array of top electrodes that collectively form a top layer over the thin film layer so as to form a plurality of capacitors with the bottom layer, each of the top electrodes comprising a transparent oxide (e.g., indium tin oxide) layer, wherein the exposure causes generation of a photocurrent from the thin film layer.

In another aspect, a method is disclosed of sensing ultra-violet radiation. The method exposing a sensor to electromagnetic radiation in which the sensor comprises: a substrate; a bottom layer coupled to the substrate, the bottom layer forming an electrode that comprises a material that includes, in part, platinum; a thin film layer coupled to the bottom layer, the thin film layer substantially spanning the bottom layer and comprising a ferroelectric thin film such as a lanthanum-doped lead zirconate titanate thin-film material (e.g., $Pb_{0.95}La_{0.5}Zr_{0.54}Ti_{0.46}O_3$); and one or more top electrodes of an array of top electrodes that collectively form a top layer over the thin film layer so as to form a plurality of capacitors with the bottom layer, each of the top electrodes comprising a transparent oxide (e.g., indium tin oxide) layer, wherein the exposure causes generation of a photocurrent from the thin film layer.

In another aspect, a method is disclosed for tracking (e.g. via real-time monitoring) and reporting estimated vitamin D dosage from direct exposure to sunlight. The method includes receiving, by a processor of a device, a plurality of data values derived from an acquired signal of a sensor (e.g., a Lanthanum doped lead zirconate titanate (PLZT) thin-film photodiode) having sensitivity to ultraviolet B intensity of sunlight; accumulating, by the processor, in a memory (e.g., persistent memory) of the device, for a pre-defined period of time, the plurality of data values; determining, by the processor, a value of estimated Vitamin D dosage for the pre-defined period of time based on the accumulated data values associated with the pre-defined period of time; and presenting, via a display (e.g., of the device or an external remote device), upon direction of the processor, a graphical representation of a parameter value (e.g., an estimated dosage value of Vitamin D obtained over a current day; an estimated dosage value of Vitamin D obtained over a current week; an estimated remaining amount value of Vitamin D dosage required or recommended for the current day (e.g., in time or dose); and/or an estimated remaining amount value of Vitamin D dosage required or recommended for the current week (e.g., in time or dose)) associated with obtained dosage of Vitamin D from exposure to direct sunlight over the course of the pre-defined period of time, wherein the parameter value is derived from the estimated vitamin D dosage for the pre-defined period of time.

In some embodiments, the parameter value is an estimated dosage value of Vitamin D obtained over a current day, over a current week, or over a user-defined period.

In some embodiments, the estimated dosage value of Vitamin D obtained over the current day, over the current week, or over the user-defined period is determined by a computing operation (e.g., multiplication, bit shifting, combination of multiplication and addition) that scales and/or offsets the accumulated data values associated with the pre-defined period of time with a set of pre-defined values (e.g., a scaling parameter and an offset parameter).

In some embodiments, the parameter value is associated with an estimated remaining amount value of Vitamin D dosage required or recommended for a current day, for a current week, or for over a user-defined period.

In some embodiments, the estimated remaining amount value of Vitamin D dosage required or recommended for the current day, for the current week, or for over the user-defined period is determined (e.g., from a look-up-table or a set of pre-defined transfer functions) based on a recommended exposure time to direct sunlight derived from a set of user-defined parameters (e.g., a first user-defined parameter associated with a user skin type or user skin sensitivity, and/or a second user-defined parameter associated with a degree of area of exposed body surface area and/or other user-defined parameter such as age, height, etc.).

In some embodiments, the method further includes determining, by the processor (e.g., from a look-up-table or a set of pre-defined transfer functions), a parameter value associated with a recommended exposure time to direct sunlight based on a set of user-defined parameters (e.g., a first user-defined parameter associated with a user skin type or a user skin sensitivity, and/or a second user-defined parameter associated with a degree of area of exposed body surface area and/or other user-defined parameter such as age, height, etc.).

In some embodiments, the set of user-defined parameters comprises a first user-defined parameter associated with a user skin type or user skin sensitivity (e.g., wherein the first user-defined parameter is determined based on a user input to a GUI of the device, based on a user input to a GUI of an application or website accessible on a remote device operatively connected to the device over a network, based on a derived value determined from a user-provided input (e.g., photo or image of the user) to the device or the application or website accessible on the remote device, or based on a scan of the user skin via a second sensor (e.g., optical sensor) located on the device).

In some embodiments, the set of user-defined parameters comprises a second user-defined parameter associated with a degree of area of exposed body surface area (e.g., wherein the second user-defined parameter is determined based on a user input to a GUI of the device (e.g., input of an exposed body area in percentage, a selection of a set of exposed body features from a predefined set of features, e.g., face, neck, hands, arms, legs, torso, etc.), based on a user input to a GUI of an application or website accessible on a remote device operatively connected to the device over a network, or based on a derived value determined from a user-provided input (e.g., photo or image of the user)).

In some embodiments, the method further includes presenting, via the display (e.g., of the device or the external remote device), upon direction of the processor, a graphical representation of a second parameter, and/or a visual cue, associated with a current UV exposure index, wherein the graphical representation of the second parameter, and/or the visual cue, indicate a current safe exposure to the direct sunlight or indicate a current harmful exposure to the direct sunlight (e.g., and generating audio or vibratory alert associated with current harmful exposure to the direct sunlight).

In some embodiments, the current UV exposure index is determined by comparing (e.g., via the processor or via digital circuitries) a parameter value derived from a last set of data values (e.g., one or more recently obtained data values, including or not including the last data value) of the plurality of data values received by the processor from the sensor to one or more UV threshold values, wherein at least one of the one or more UV threshold values is associated with the current safe exposure to the direct sunlight or the current harmful exposure to the direct sunlight. In other embodiments, the current UV exposure index is determined by comparing (e.g., via analog circuitries) a currently acquired signal of the sensor to one or more UV threshold signal levels, wherein at least one of the one or more UV threshold signal levels is associated with the current safe exposure to the direct sunlight or the current harmful exposure to the direct sunlight.

In some embodiments, the sensor comprises a PLZT thin-film ($Pb_{0.95}La_{0.05}Zr_{0.54}Ti_{0.46}O_3$) photodiode, a $PbZr_{1-x}Ti_xO_3$-based photodiode, or a $(Pb_{1-y}La_y)(Zr_xTi_{1-x})O_3$-based photodiode wherein $0 \leq x \leq 1$ (such as 0.5) and $0 \leq y \leq 0.1$ (such as 0.05).

In some embodiments, the sensor is selected from the group consisting of a SiC-based (Silicon-Carbide-based) photodiode, a GaN-based (Gallium-Nitride-based) photodiode, an AlGaN (Aluminum-Gallium-Nitride-based) photodiode; a $PbTiO_3$-based photodiode, a $BaTiO_3$-based photodiode, a $SrTiO_3$-based photodiode, a $Ba_xSr_{1-x}TiO_3$-based photodiode, a $(1-x)BaTiO_3-(x)BiFeO_3$-based photodiode, a $KNbO_3$-based photodiode, a ZnO-based photodiode, a MgZnS-based photodiodes, a $LaAlO_3$-based photodiode, ZnMgO-based photodiode.

In some embodiments, the device is a hand-held device or a wearable device. In some embodiments, the device is a component of, or a set of components in, a mobile electronic device (e.g., smartphone or wearable device having a form of a watch, a hat, a headpiece, a neck piece, a neck band, a bracelet, a ring, an eye piece, an arm band).

In some embodiments, the method further includes transmitting, by the processor (e.g., via direct communication (e.g. Bluetooth/airdrop) or over a computing network), to a remote computing device (e.g., a user computing device or a third-party server), one or more device parameters values associated with i) the determined value of estimated Vitamin D dosage for the pre-defined period of time, ii) the accumulated data values associated with the pre-defined period of time, or iii) the presented parameter value associated with the obtained dosage of Vitamin D from the exposure to direct sunlight over the course of the pre-defined period of time (e.g., wherein the one or more transmitted device parameters values are stored over time, e.g., to create and display a Vitamin D dose profile, or for further analysis, e.g., to direct therapy for Vitamin D deficiency conditions or disorders).

In another aspect, an apparatus is disclosed for tracking (e.g., via real-time monitoring) and reporting estimated vitamin D dosage from direct exposure to sunlight. The apparatus includes a processor; and a memory having instructions stored thereon, wherein the instructions when executed by the processor, cause the processor to: receive a plurality of data values derived from an acquired signal of a sensor (e.g., a Lanthanum doped lead zirconate titanate (PLZT) thin-film photodiode, a SiC photodiode, a GaN photodiode, an InGaN photodiode, an AlGaN photodiode, a $PbTiO_3$-based photodiode, a $BaTiO_3$-based photodiode, a $SrTiO_3$-based photodiode, a $Ba_xSr_{1-x}TiO_3$-based photodiode, a $(1-x)BaTiO_3-(x)BiFeO_3$-based photodiode, a $PbZr_{1-x}Ti_xO_3$-based photodiode, a $(Pb_{1-y}La_y)(Zr_xTi_{1-x})O_3$-based photodiode wherein $0 \leq x \leq 1$ (such as 0.5) and $0 \leq y \leq 0.1$ such as (0.05), a $KNbO_3$-based photodiode, a ZnO-based photodiode, a MgZnS-based photodiodes, a $LaAlO_3$-based photodiode, a ZnMgO-based photodiode) having sensitivity to ultraviolet B radiation of sunlight; accumulate, for a pre-defined period of time, the plurality of data values; determine a value of estimated Vitamin D dosage for the pre-defined period of time based on the accumulated data values associated with the pre-defined period of time; and cause graphical representation of a parameter value (e.g., an estimated dosage value of Vitamin D obtained over a current day; an estimated dosage value of Vitamin D obtained over a current week; an estimated remaining amount value of Vitamin D dosage required or recommended for the current day (e.g., in time or dose); and/or an estimated remaining amount value of Vitamin D dosage required or recommended for the current week (e.g., in time or dose)) associated with obtained dosage of Vitamin D from exposure to direct sunlight over the course of the pre-defined period of time, wherein the parameter value is derived from the estimated vitamin D dosage for the pre-defined period of time.

In some embodiments, the apparatus further includes a housing having a display coupled thereto, the housing forming a hand-held device or wearable system.

In some embodiments, the apparatus further includes a housing and an attachment member, collectively having a form of a watch, a hat, a headpiece, a neck piece, a neck band, a bracelet, a ring, an eye piece, an arm band.

In some embodiments, the instructions when executed by the processor, further cause the processor to: determine (e.g., from a look-up-table or a set of pre-defined transfer functions) a parameter value associated with recommended exposure time to direct sunlight based on a set of user-defined parameters (e.g., a first user-defined parameter associated with a user skin type or a user skin sensitivity, and/or a second user-defined parameter associated with a degree of area of exposed body surface area).

In some embodiments, the instructions when executed by the processor, further cause the processor to: compare a parameter value, derived from a last set of data values of the plurality of data values received by the processor from the sensor, to one or more UV threshold values, wherein at least one of the one or more UV threshold values is associated with a current safe exposure to the direct sunlight or a current harmful exposure to the direct sunlight; and present one or more graphical representations of a second parameter, and/or a visual cue, associated with a current UV exposure index, wherein the graphical representation of the second parameter, and/or the visual cue, indicate the current safe exposure to the direct sunlight or the current harmful exposure to the direct sunlight.

BRIEF DESCRIPTION OF THE DRAWINGS

The accompanying drawings, which are incorporated in and constitute a part of this specification, illustrate embodiments and together with the description, serve to explain the principles of the methods and systems:

FIG. 19 is a table showing example UV index levels from the measured output of the ferroelectric UV sensor, in accordance with an illustrative embodiment.

FIG. 23 shows a table that includes different Vitamin D requirements or recommendations for a person based on the person's age, in accordance with an illustrative embodiment.

FIG. 25 shows a table that includes different calculated UVB dosage determined based on different values of exposure time to UVB radiation and on different values of UVB radiation intensity, in accordance with an illustrative embodiment.

DETAILED DESCRIPTION

Before the present methods and systems are disclosed and described, it is to be understood that the methods and systems are not limited to specific methods, specific components, or to particular compositions. It is also to be understood that the terminology used herein is for the purpose of describing particular embodiments only and is not intended to be limiting.

As used in the specification and the appended claims, the singular forms "a," "an" and "the" include plural referents unless the context clearly dictates otherwise. Ranges may be expressed herein as from "about" one particular value, and/or to "about" another particular value. When such a range is expressed, another embodiment includes from the one particular value and/or to the other particular value. Similarly, when values are expressed as approximations, by use of the antecedent "about," it will be understood that the particular value forms another embodiment. It will be further understood that the endpoints of each of the ranges are significant both in relation to the other endpoint, and independently of the other endpoint.

"Optional" or "optionally" means that the subsequently described event or circumstance may or may not occur, and that the description includes instances where said event or circumstance occurs and instances where it does not.

Throughout the description and claims of this specification, the word "comprise" and variations of the word, such as "comprising" and "comprises," means "including but not limited to," and is not intended to exclude, for example, other additives, components, integers or steps. "Exemplary" means "an example of" and is not intended to convey an indication of a preferred or ideal embodiment. "Such as" is not used in a restrictive sense, but for explanatory purposes. Disclosed are components that may be used to perform the disclosed methods and systems. These and other components are disclosed herein, and it is understood that when combinations, subsets, interactions, groups, etc. of these components are disclosed that while specific reference of each various individual and collective combinations and permutation of these may not be explicitly disclosed, each is specifically contemplated and described herein, for all methods and systems. This applies to all aspects of this application including, but not limited to, steps in disclosed methods. Thus, if there are a variety of additional steps that may be performed it is understood that each of these additional steps may be performed with any specific embodiment or combination of embodiments of the disclosed methods.

Figure 1:
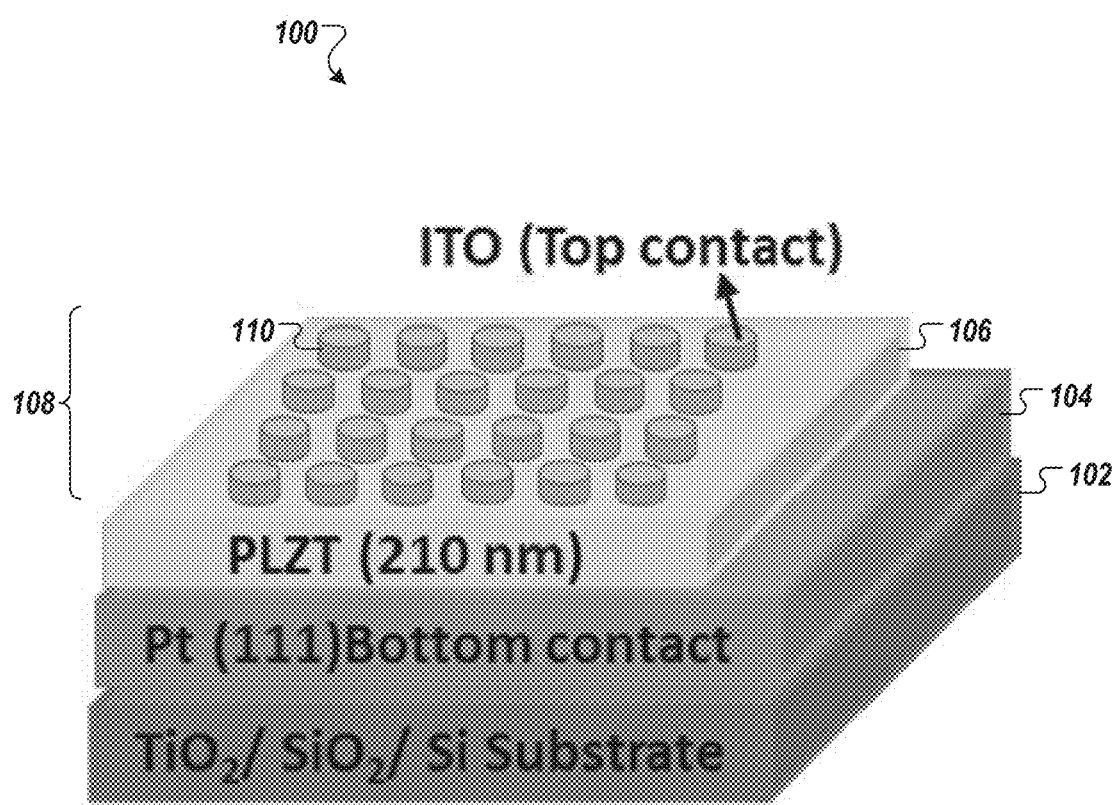
FIG. 1 illustrates an apparatus (e.g., for use as a solar cell, a UV sensor, a UV index sensor, etc.) with ferroelectric-based photodiode (e.g., $Pb_{0.95}La_{0.5}Zr_{0.54}Ti_{0.46}O_3$ (PLZT)) thin film paired with a bottom metal and top transparent conductive oxide, that forms a capacitor structure with enhanced photocurrent and power conversion efficiency, in accordance with an illustrative embodiment.

FIG. 1 illustrates an apparatus 100 (e.g., for use as a solar cell, a UV sensor, a UV index sensor, etc.) with ferroelectric-based photodiode (e.g., $Pb_{0.95}La_{0.5}Zr_{0.54}Ti_{0.46}O_3$ (PLZT)) thin film paired with a bottom metal and top transparent conductive oxide, that forms a capacitor structure with enhanced photocurrent and power conversion efficiency, in accordance with an illustrative embodiment.

As shown in FIG. 1, the apparatus 100 includes a substrate 102 (shown as "$TiO_2/SiO_2/Si$ Substrate" 102), a bottom layer 104 (shown as "Pt (111) Bottom contact" 104), a thin film layer 106 (shown as "PLZT (210 nm)" 106) comprising a ferroelectric-based photodiode such as a lanthanum-doped lead zirconate titanate (PLZT) thin-film material (e.g., $Pb_{0.95}La_{0.05}Zr_{0.54}Ti_{0.46}O_3$), and an array of top electrodes 108 (shown as "ITO (Top contact)" 108). Each individual electrode of the array 108 is referenced herein as 110. In some embodiments, the bottom layer 104 and the top electrodes 110 each forms back-to-back Schottky contacts with the thin film layer 106. The Schottky barriers formed at the interfaces between each of the thin film layer 106 and the electrodes (e.g., 104, 110) create polarization independent interface electric field.

In some embodiments, the thin film layer 106 is formed of a ferroelectric-based photodiode comprising a $PbZr_{1-x}Ti_xO_3$-based device or a $(Pb_{1-y}La_y)(Zr_xTi_{1-x})O_3$-based device, where $0 \leq x \leq 1$ (such as 0.5) and $0 \leq y \leq 0.1$ (such as 0.05). In some embodiments, the ferroelectric-based photodiode comprises a Lanthanum doped lead zirconate titanate (PLZT) thin-film such as $Pb_{0.95}La_{0.05}Zr_{0.54}Ti_{0.46}O_3$ as noted above.

Referring still to FIG. 1, the bottom layer 104 is coupled to the substrate 102 and forms an electrode, in some embodiments, that comprises a material that includes, in part, platinum. In some embodiments, and as shown in FIG. 1, the bottom layer 104 is comprised of a platinum (111) structure. Other platinum-based alloys and structure and composition may be used. The substrate 102, as shown in the example of FIG. 1, may be a $TiO_2$, $SiO_2$, or Si. Other substrate material such as $Nb:SrTiO_3$, Quartz, among others, can be used.

Referring still to FIG. 1, the thin film layer 106 is coupled to, and substantially spans, the bottom layer 104. The thin film layer 106 comprises predominantly, ferroelectric-based photodiode such as a lanthanum-doped lead zirconate titanate thin-film material, e.g., $Pb_{0.95}La_{0.05}Zr_{0.54}Ti_{0.46}O_3$ or other ferroelectric-based photodiode as described herein. Description of $Pb_{0.95}La_{0.05}Zr_{0.54}Ti_{0.46}O_3$ thin films, and like films, can be found, for example, in Harshan et al., "Influence of work-function of top electrodes on the photovoltaic characteristics of $Pb_{0.95}La_{0.05}Zr_{0.54}Ti_{0.46}O_3$ thin film capacitors", Applied Physics Letters 100.17 (2012); Nampoori, "$Pb_{0.95}La_{0.05}Zr_{0.54}Ti_{0.46}O_3$ Thin Films For Photovoltaic Applications," arXiv preprint arXiv:1304.1611 (2013); Batra, Vaishali et al., "Optical constants and band gap determination of $Pb_{0.95}La_{0.05}Zr_{0.54}Ti_{0.46}O_3$ thin films using spectroscopic ellipsometry and UV-visible spectroscopy," Optical Materials 49, pp. 123-128 (2015); and Harshan et al., "Photovoltaic and Ferroelectric Properties of $Pb_{0.95}La_{0.05}Zr_{0.54}Ti_{0.46}O_3$ Thin Films under Dark and Illuminated Conditions," Ferroelectrics 470.1, pp. 99-106 (2014), each of which is incorporated by reference in its entirety.

The PV effects of the thin film layer 106 can be tuned, for example, by controlling the polarization in ferroelectric materials. When exposed to sunlight, ferroelectric material in a given device absorbs photons, which can generate charge carriers, also called photogenerated carriers. These photogenerated carriers are often separated by in-built electric field present in the photoactive ferroelectric layer and can cause the flow of electric current or photocurrent. Because this electric field can be present throughout the bulk region of the material—that is, the PV effect in such materials is a bulk phenomenon, which is limited to depletion region in the semiconductor based devices—this phenomenon of photons absorption and separation of charge carriers can generate photovoltage between a top and a bottom electrode. This photovoltage value in ferroelectric material devices is not limited to bandgap of the material, the value can exceed higher than bandgap which is not true for semiconductor based devices.

Referring still to FIG. 1, the array of top electrodes 108 collectively forms a transparent oxide (e.g., indium tin oxide—ITO) top layer over the thin film layer 106 so as to form a plurality of capacitors. ITO has desirable transparent nature and high electrical conductivity, which is demonstrated to increase the transport mechanism in the apparatus 100 of FIG. 1. In some embodiments, the capacitor structure is formed between one or more top electrodes 110 and the bottom layer 104 across the thin film layer 106. In other embodiments, the capacitor structure is formed among electrodes of the array of top electrodes across the thin film layer 106. The electrodes 108, in some embodiments, is made of a metal or a metal-based alloy that at least includes Pt, Au, Al, Ag, Ti, Cr, and/or Ir. In some embodiments, the electrodes 108 is a transparent conducting oxides (e.g., such as $In_2O_3$, In doped Tin oxide (In—$SnO_2$ or ITO)), or combinations thereof. Other electrode material can be used.

Figure 2:
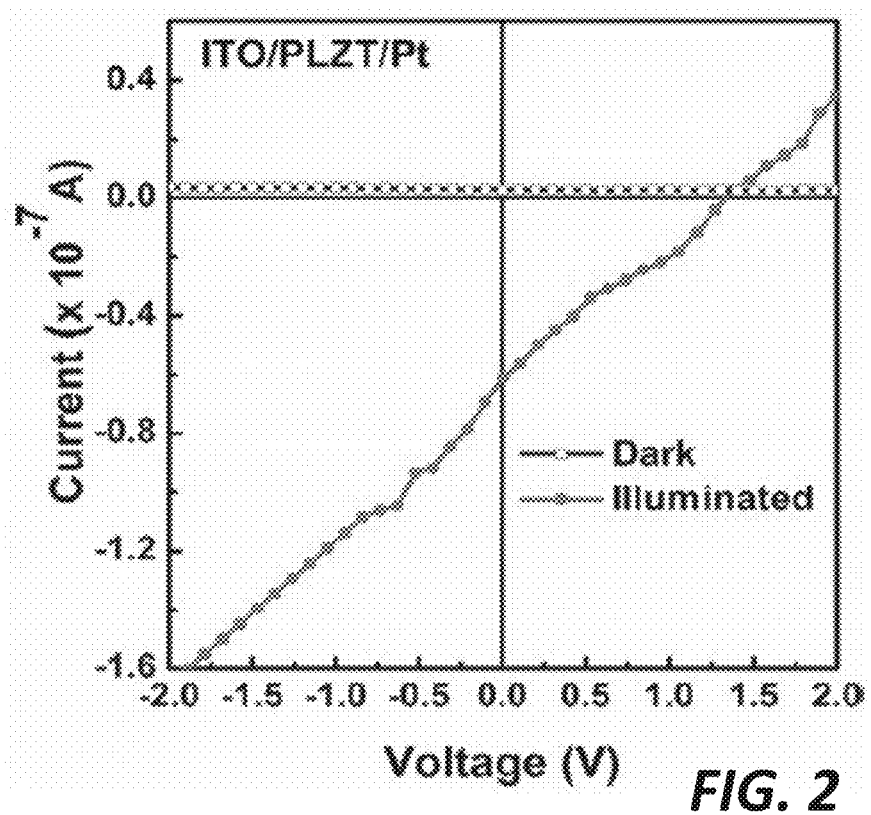
FIG. 2 is a diagram showing a current-voltage characteristic of the apparatus of FIG. 1, in particular, the dark and illuminated current voltage curve, in accordance with an illustrative embodiment.
Figure 3:
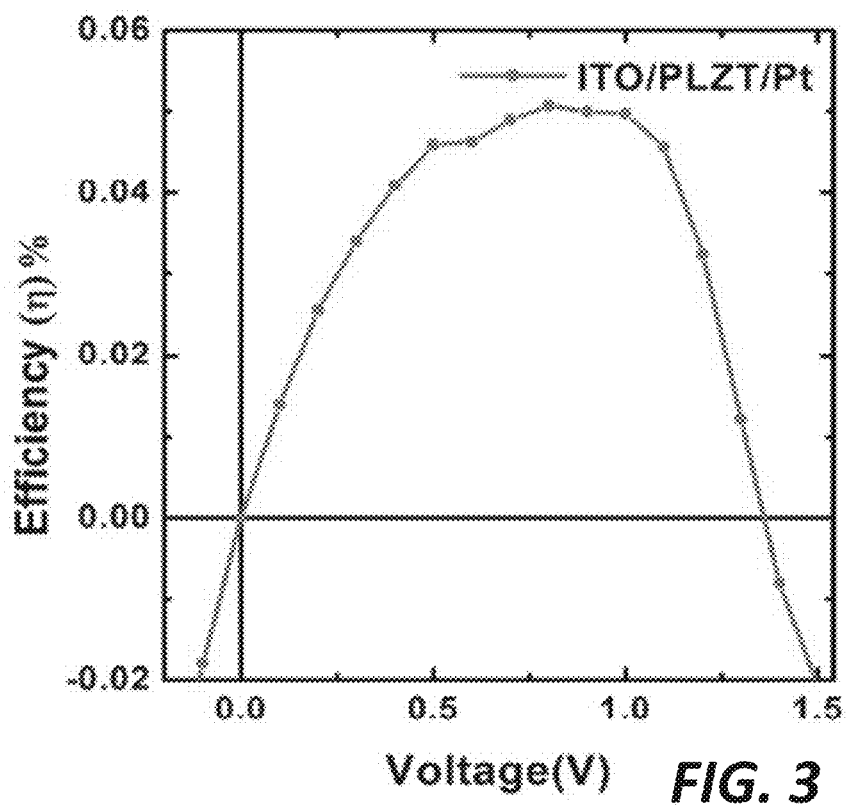
FIG. 3 is a diagram showing a light-to-electricity conversion curve of voltage corresponding to the current voltage curve of FIG. 2, in accordance with an illustrative embodiment.

FIG. 2 is a diagram showing a current-voltage characteristic of the apparatus 100 of FIG. 1, in particular, the dark and illuminated current voltage curve, in accordance with an illustrative embodiment. FIG. 3 is a diagram showing a light-to-electricity conversion curve of voltage corresponding to the current voltage curve of FIG. 2, in accordance with an illustrative embodiment.

Figure 4A:
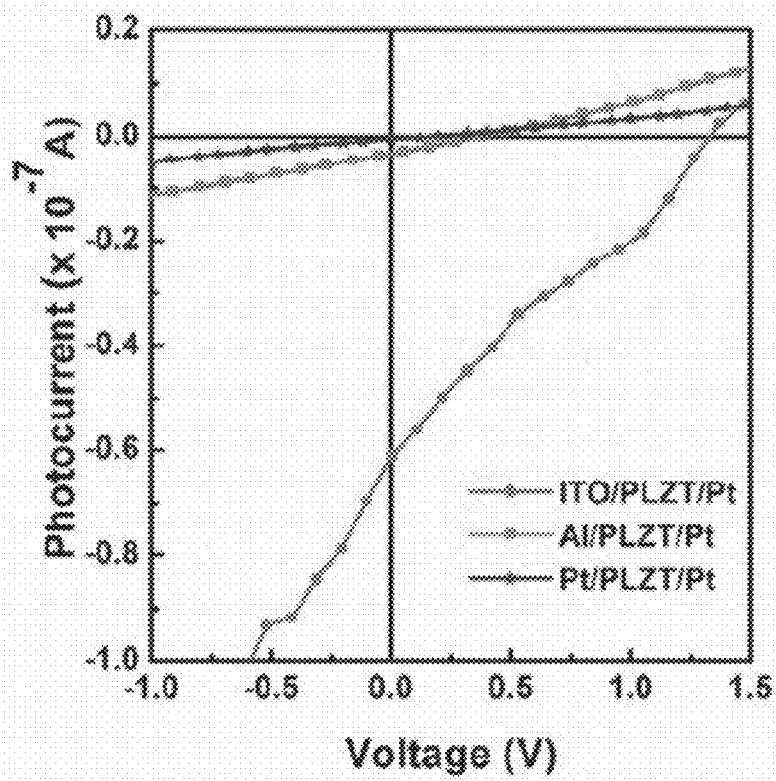
FIG. 4A is a diagram showing a comparison of the dark and illuminated current voltage curve of the apparatus of FIG. 1 (having an ITO/PLZT/Pt structure) to two alternative structures (e.g., Al/PLZT/Pt and Pt/PLZT/Pt), in accordance with an illustrative embodiment.
Figure 4B:
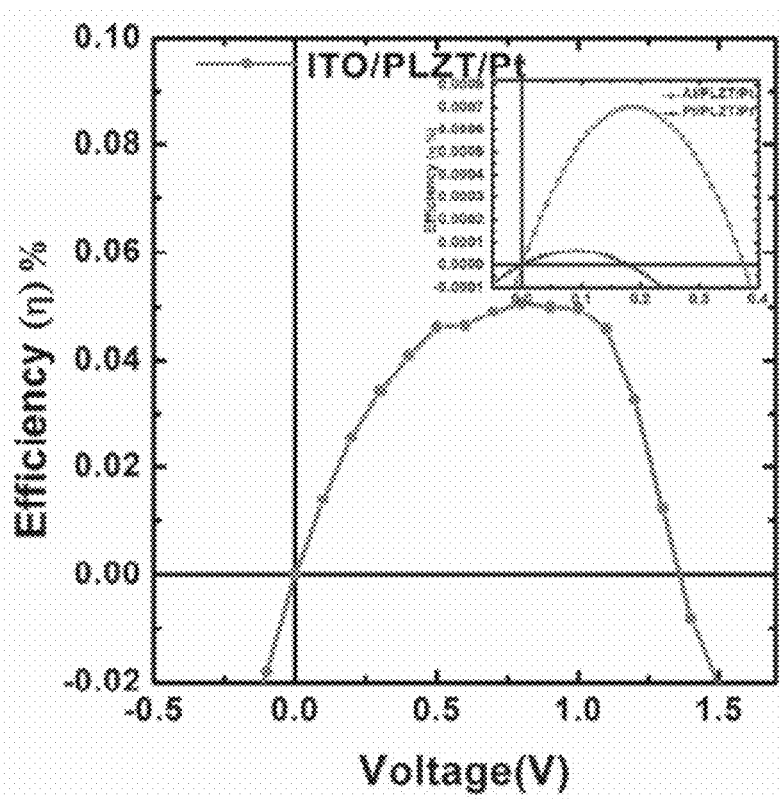
FIG. 4B is a diagram showing the light-to-electricity conversion curve of FIG. 3 (corresponding to the apparatus of FIG. 1) conversion curves of the two alternative structures (e.g., Al/PLZT/Pt and Pt/PLZT/Pt), in accordance with an illustrative embodiment.

FIG. 4A is a diagram showing a comparison of the dark and illuminated current voltage curve of the apparatus 100 of FIG. 1 (having an ITO/PLZT/Pt structure) to two alternative structures (e.g., Al/PLZT/Pt and Pt/PLZT/Pt), in accordance with an illustrative embodiment. FIG. 4B is a diagram showing the light-to-electricity conversion curve of FIG. 3 (corresponding to the apparatus 100 of FIG. 1) conversion curves of the two alternative structures (e.g., Al/PLZT/Pt and Pt/PLZT/Pt), in accordance with an illustrative embodiment. Notably, as shown in FIG. 4B, the apparatus 100 of FIG. 1 has a demonstrated conversion efficiency about 3 orders of magnitude higher than that of a Pt/PLZT/Pt structure and about 2 orders of magnitude higher than that of an A/PLZT/Pt structure. Table 1 illustrates comparison results, per FIGS. 4A and 4B, of the apparatus 100 of FIG. 1 and the two alternative structures (e.g., Al/PLZT/Pt and Pt/PLZT/Pt) with respect to open circuit voltage $V_{oc}$ (in volts), photocurrent density $J_{sc}$ (in Amp per $cm^2$), and conversion efficiency (in percent).

TABLE 1

| Capacitors | $V_{oc}$ (V) | $J_{sc}$ (A/cm$^2$) | Efficiency (%) |
|---|---|---|---|
| Pt/PLZT/Pt | 0.17 | $-6.4 \times 10^{-7}$ | $\sim 6.31 \times 10^{-5}$ |
| Al/PLZT/Pt | 0.37 | $-3.6 \times 10^{-6}$ | $\sim 7.08 \times 10^{-4}$ |
| ITO/PLZT/Pt | 1.31 | $-6.8 \times 10^{-5}$ | $\sim 4.5 \times 10^{-2}$ |

Figure 5A:
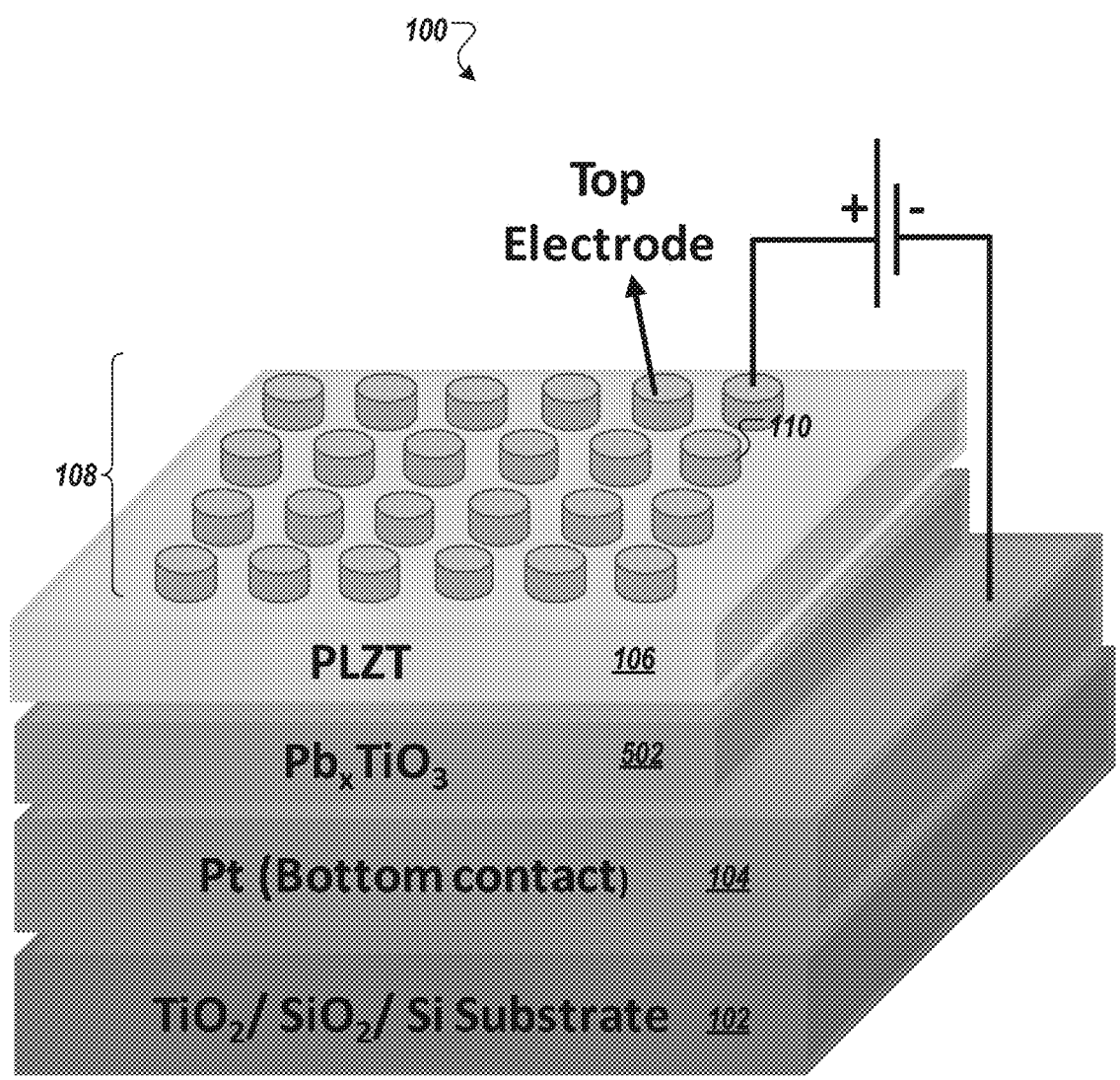
FIGS. 5A and 5B are diagrams of an apparatus thin film that includes a bottom metal and a top electrode/ITO layer that is formed with a seed layer of lead titanate, in accordance with an illustrative embodiment.
Figure 5B:
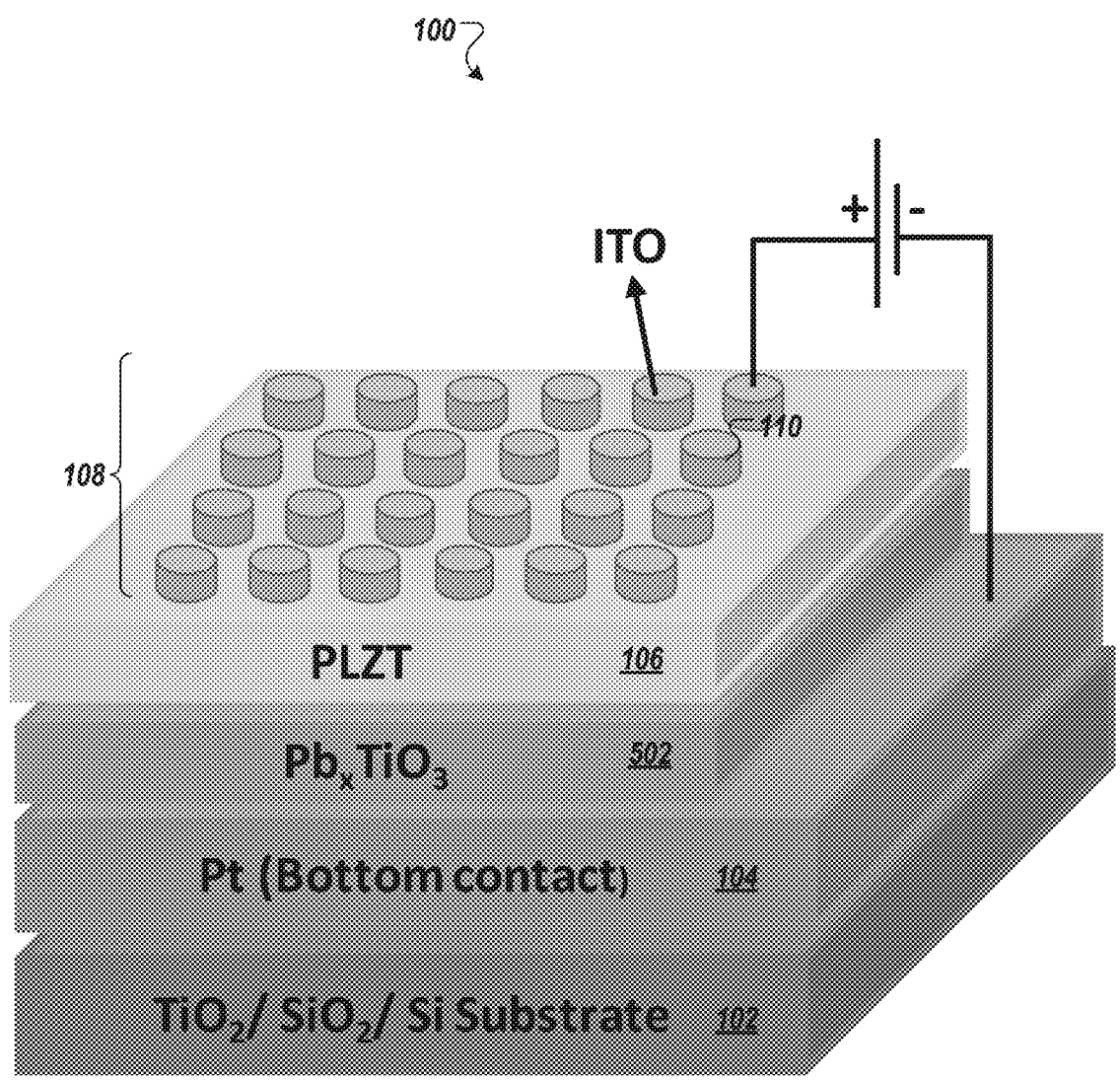

FIGS. 5A and 5B are diagrams of an apparatus thin film that includes a bottom metal and a top electrode/ITO layer (that forms a capacitor structure with enhanced photocurrent and power conversion efficiency) and formed on a seed layer 502 of lead titanate, in accordance with an illustrative embodiment.

In some embodiments, the seed layer 502 of lead titanate comprises $Pb_xTiO_3$, where x=1.0, 1.05, 1.1, or 1.2. In other embodiments, the seed layer 502 includes PbO, $PbZrO_3$, $LaNiO_3$, and/or $TiO_x$ (x≤2). In yet other embodiments, the seed layer 502 includes $SrTiO_3$ and/or $SrRuO_3$. In yet other embodiments, the seed layer 502 includes $La_xSr_{1-x}CoO_3$, where 0<x<1 and/or $La_xSr_{1-x}MnO_3$ where 0<x<1.

In some embodiments, the seed layer 502 of lead titanate is configured to promote (001) orientation and suppress (110) orientation in the PLZT thin film layer 106. Such orientation of the PLZT thin film layer 106, e.g., as produced by inclusion of the seed layer, enhances the magnitude of both short circuit current and open circuit voltage of the capacitor structure that is formed, e.g., in an electrode/PLZT/Pt structure in which the electrode is a metal or a metal-based alloy that at least includes Pt, Au, Al, Ag, Ti, Cr, Ir (see FIG. 5A). In some embodiments, electrode/PLZT/Pt structure is formed with an ITO top layer, such as $In_2O_3$, In-doped Tin oxide (In—$SnO_2$ or ITO) (see FIG. 5B). As noted above, other materials can be used.

FIGS. 6, 7, 8, 9, 10, 11 each illustrates the apparatus 100 (e.g., for use as a solar cell, a UV sensor, a UV index sensor, etc.) with a ferroelectric thin film such as a $Pb_{0.95}La_{0.05}Zr_{0.54}Ti_{0.46}O_3$ PLZT thin film paired with a bottom metal and top transparent conductive oxide, that forms a capacitor structure with enhanced photocurrent and power conversion efficiency, in accordance with various illustrative embodiment. It is noted that the structures shown in FIGS. 6, 7, 8, 9, 10, 11 can be applied to the apparatus 100 of FIG. 1, FIG. 5A or FIG. 5B, as well as in combination with one another.

Figure 6:
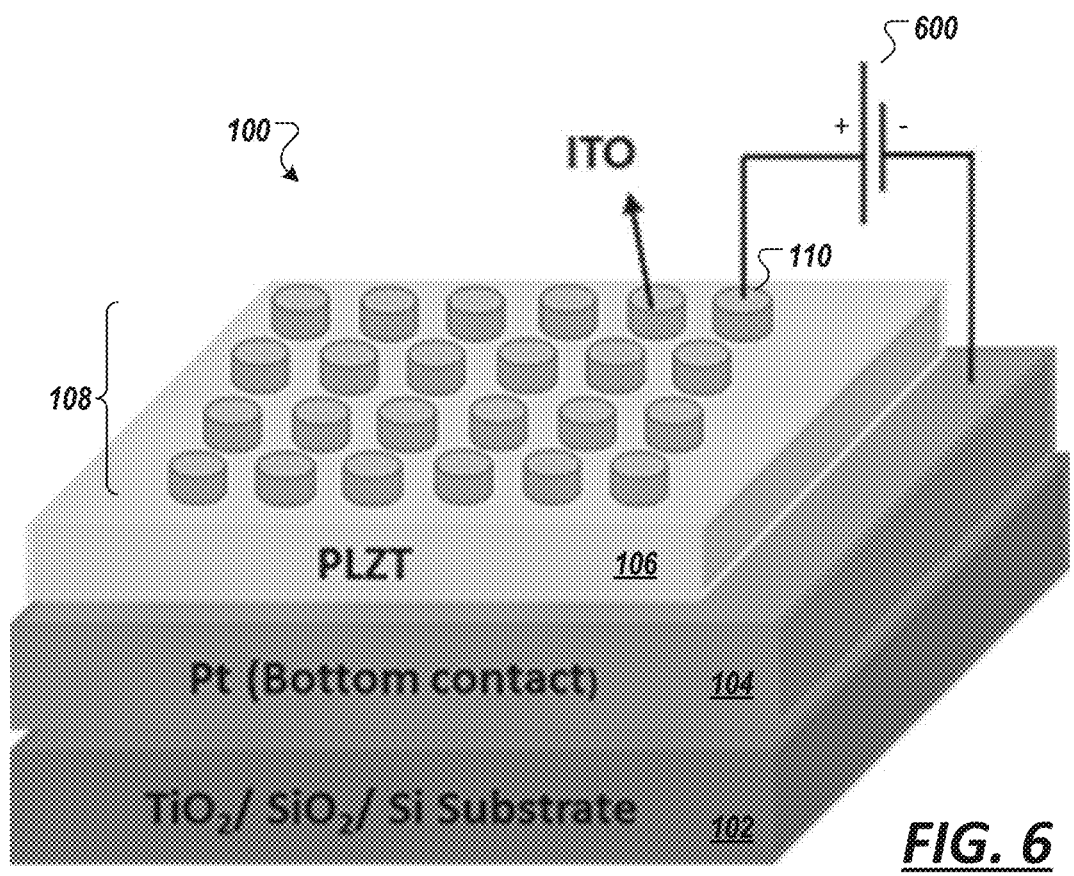
FIGS. 6, 7, 8, 9, 10, 11 each illustrates the apparatus (e.g., for use as a solar cell, a UV sensor, a UV index sensor, etc.) with a ferroelectric thin film such as $Pb_{0.95}La_{0.5}Zr_{0.54}Ti_{0.46}O_3$ (PLZT) thin film paired with a bottom metal and top transparent conductive oxide, that forms a capacitor structure with enhanced photocurrent and power conversion efficiency, in accordance with various illustrative embodiment.

In FIG. 6, the capacitor structure 600 is formed between a top electrode 110 of the array 108 and a portion of the bottom layer 104 across a corresponding portion of the ferroelectric thin film such as the $Pb_{0.95}La_{0.05}Zr_{0.54}Ti_{0.46}O_3$ thin film layer 106. In some embodiments, each layer (e.g., 104, 106, 108) are parallel to each other and/or deposited on over one other.

Figure 7:
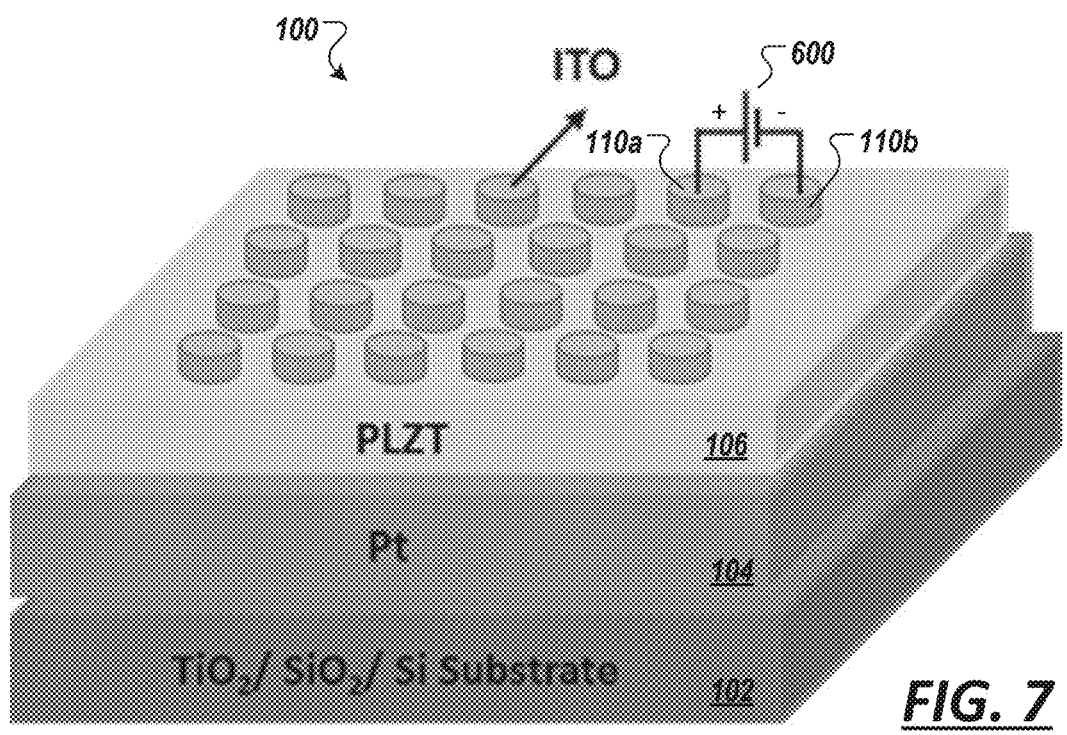

In FIG. 7, the capacitor structure (e.g., shown by polarity 600) is formed (lateral configuration) between two top electrodes (shown as 110a and 110b) of the array 108 across a corresponding portion of the ferroelectric thin film such as the $Pb_{0.95}La_{0.5}Zr_{0.54}Ti_{0.46}O_3$ thin film layer 106. In some embodiments, electrodes (e.g., 110), which are separated by a finite distance, are deposited on the surface of the thin film layer 106.

Figure 8:
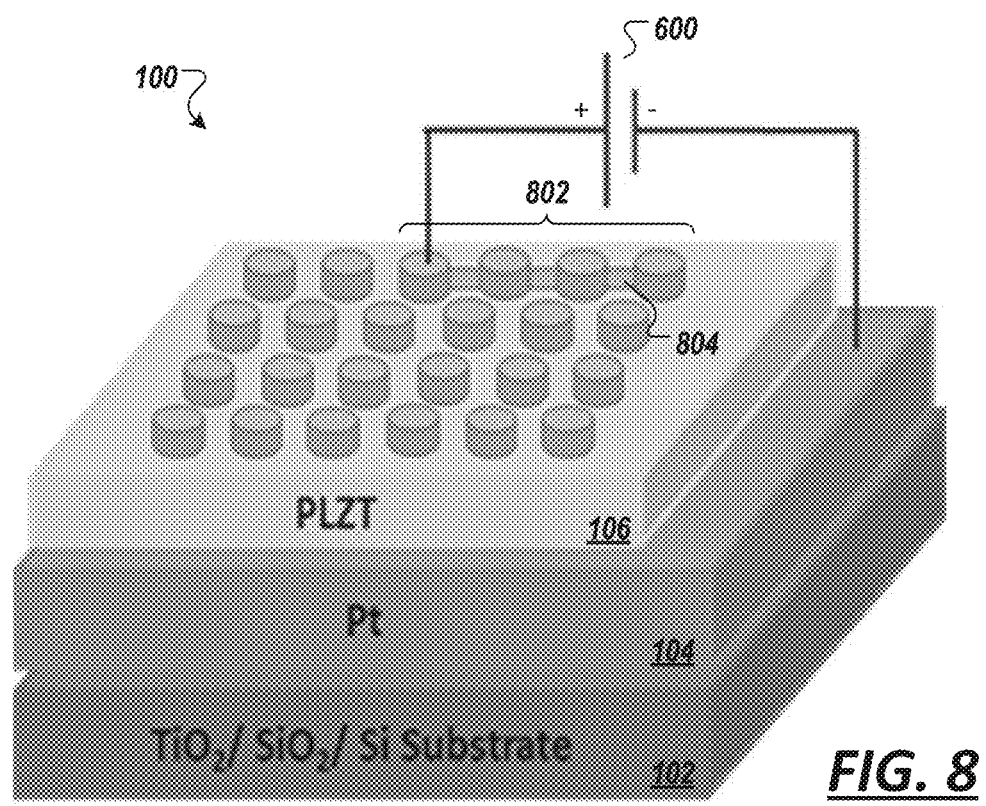

In FIG. 8, the capacitor structure (e.g., shown by polarity 600) is formed (as a vertical configuration with plurality of electrodes connected in series, parallel, or combination thereof) between a plurality of top electrodes 802 serially connected to one another, via a connection member 804, and a corresponding portion of the bottom layer 104 (generally corresponding to the area of the plurality of top electrodes 802) across the a corresponding portion of the ferroelectric thin film such as the $Pb_{0.95}La_{0.5}Zr_{0.54}Ti_{0.46}O_3$ thin film layer 106 (generally corresponding to the area of the plurality of top electrodes 802). This parallel plate electrode configuration provides an increased surface area over that of a single electrode.

Figure 9:
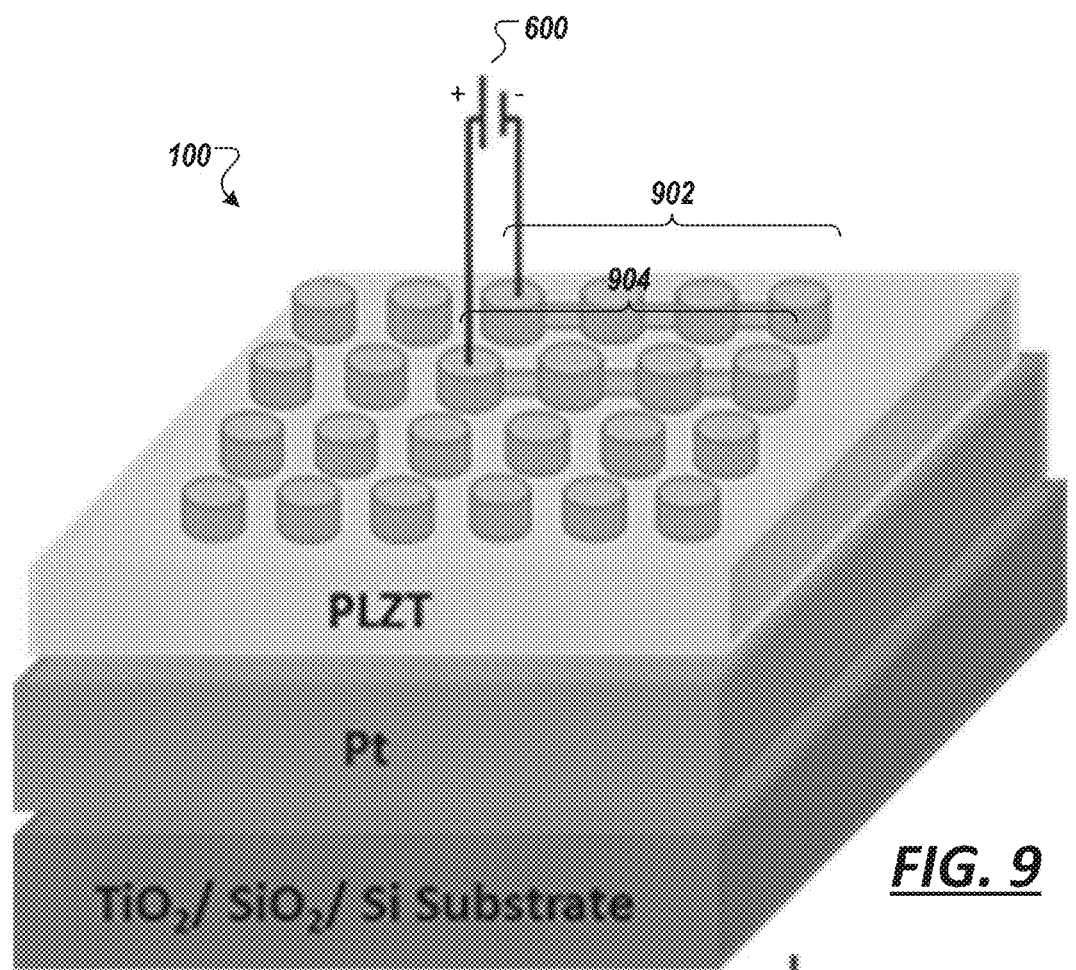
Figure 10:
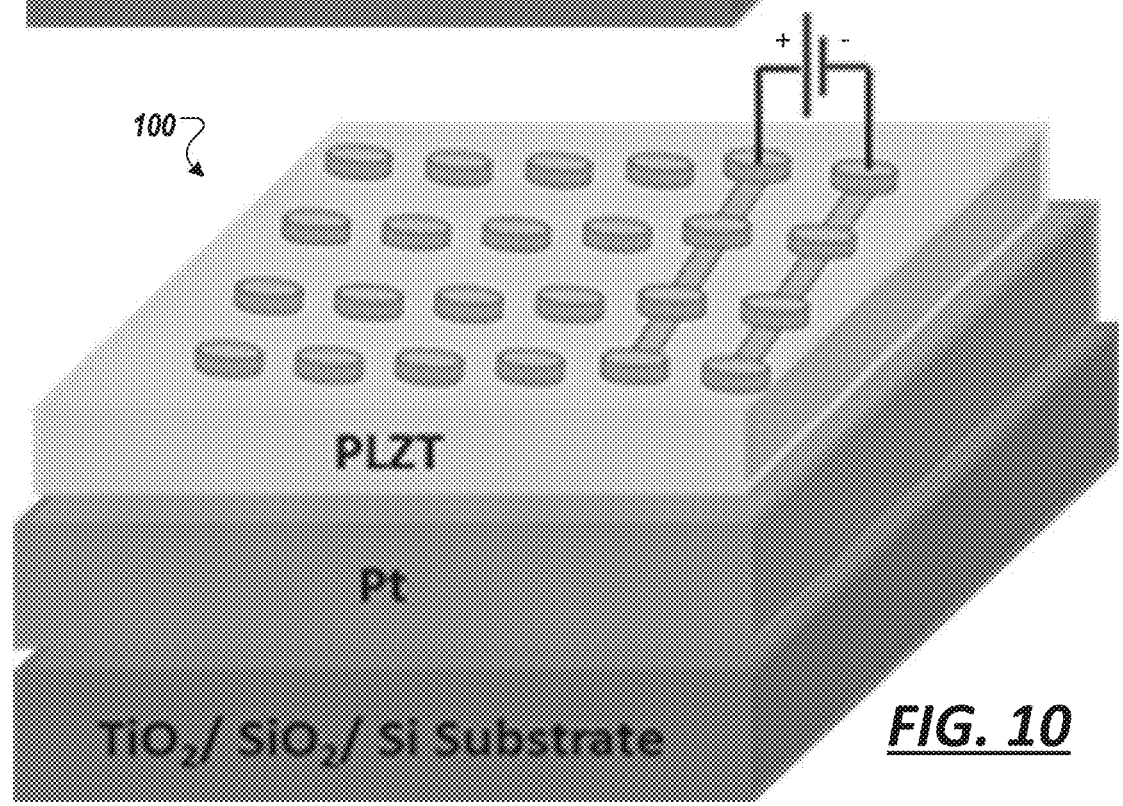

In FIGS. 9 and 10, the capacitor structure (e.g., shown by polarity 600 as a lateral configuration with a plurality of electrodes connected in series, parallel, or combination thereof) is formed between a first plurality of top electrodes 902 serially connected to one another and a second plurality of top electrodes 904 across the a corresponding portion of the ferroelectric thin film such as the $Pb_{0.95}La_{0.05}Zr_{0.54}Ti_{0.46}O_3$ thin film layer 106. In some embodiments, the electrodes structure (e.g., 902, 904) are symmetric to one another. In addition to being serially connected, the plurality of top electrodes 902 and 904 may be configured as a parallel circuit or a combination of serial and parallel circuit. Without wishing to be bound to a particular theory, array of electrodes can provide a means of increasing the effective exposure area of the device so as to increase light absorption and in turn can result in higher photovoltaic parameters.

Although shown in FIGS. 6-10 as circular electrodes, the top electrodes 110 can be configured in any closed, coiled, patterned, or opened shapes, including oval, square, rectangle, rhombus, and etc.

Figure 11:
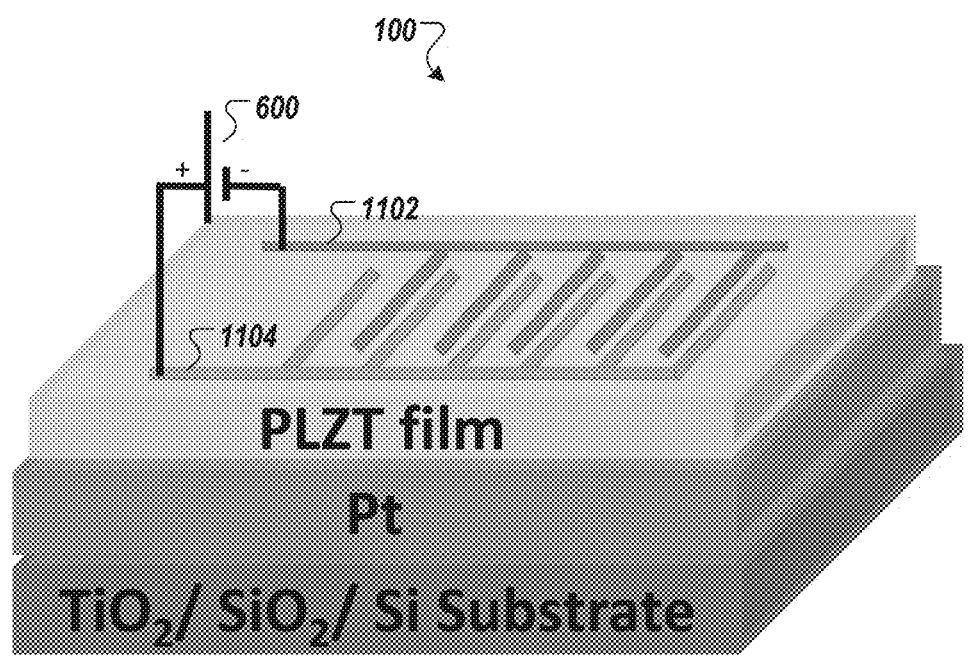

In FIG. 11, the capacitor structure (e.g., shown by polarity 600) is formed between a first top electrode 1102 and a second top electrode 1104, which collectively forms a structure that forms gaps thereamong so as to form the plurality of capacitors. In some embodiments, the structure is formed on a plane. In other embodiments, the structure is formed on more than one planes.

Ultraviolet Sensor Using a Ferroelectric Thin Film

Figure 12:
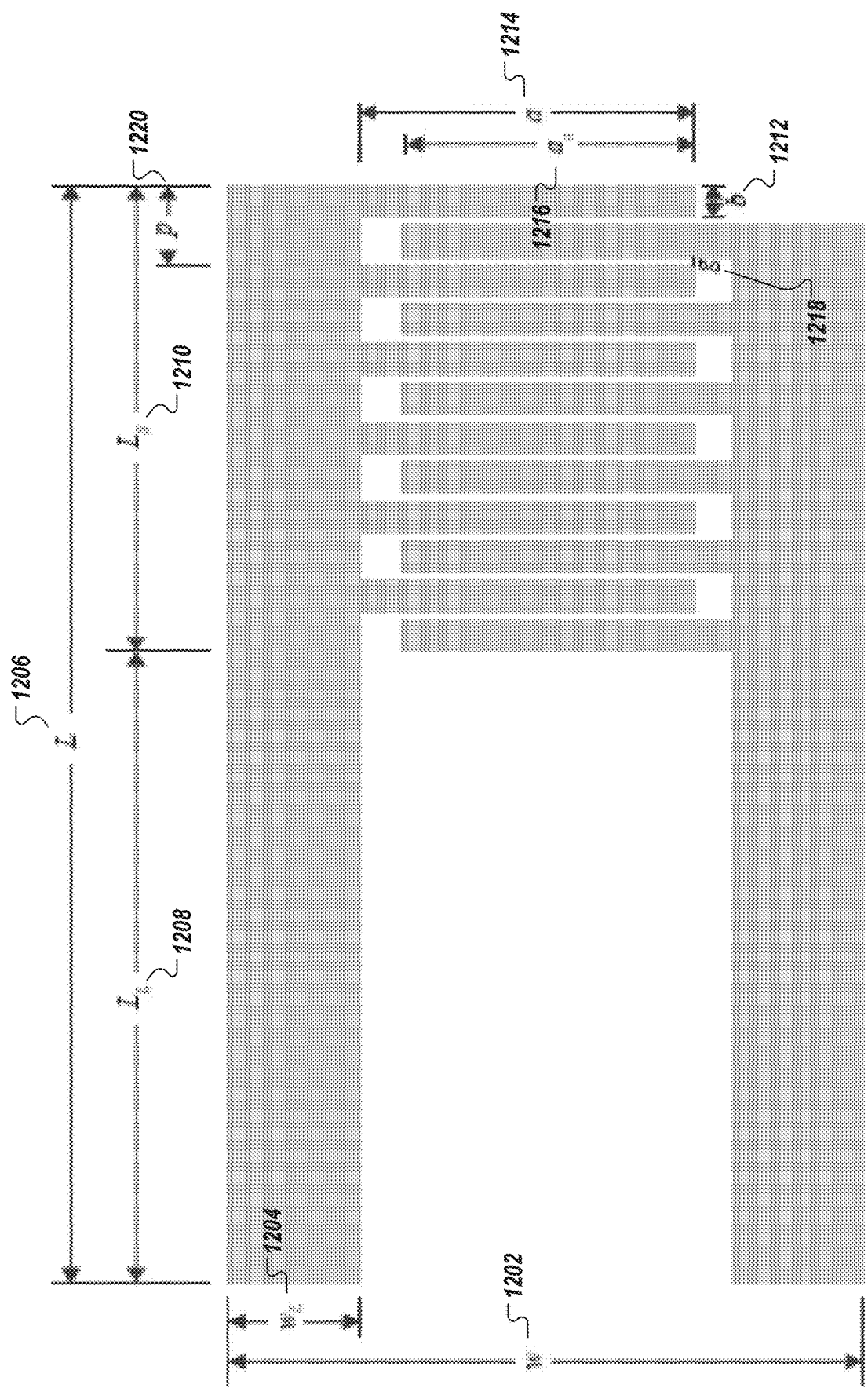
FIG. 12 is a diagram showing an example structure of the electrode of the apparatus of FIG. 11, e.g., for use in a UV sensor, in accordance with an illustrative embodiment.

FIG. 12 is a diagram showing an example structure of electrode of the apparatus 100 of FIG. 11, e.g., for use in a UV sensor, in accordance with an illustrative embodiment.

As shown in FIG. 12, the structure may be defined by geometric parameters, including, as those shown, a device-width parameter w (1202), a lead width parameter $w_L$ (1204), a device length parameter L (1206), a lead length parameter $L_L$ (1208), a sensor grid length parameter $L_S$ (1210), a finger width parameter b (1212), a comb finger length parameter a (1214), a finger-overlap length parameter $a_o$ (1216), a lead-finger gap parameter g (1218), a comb-pitch parameter p (1220), and a number of finger on each comb parameter N. Other parameters, shapes, and structures may be formed.

Figure 13A:
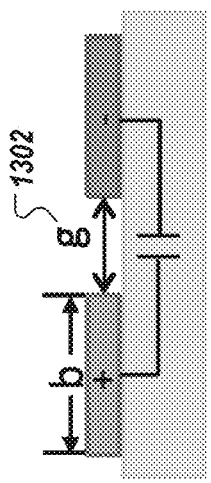
FIGS. 13A and 13B each show cross-sectional views of one or more capacitor structures formed from top electrodes across the thin film layer (e.g., as shown, as applicable, in 7, 9, 10, and 11), in accordance with an illustrative embodiment.
Figure 13B:
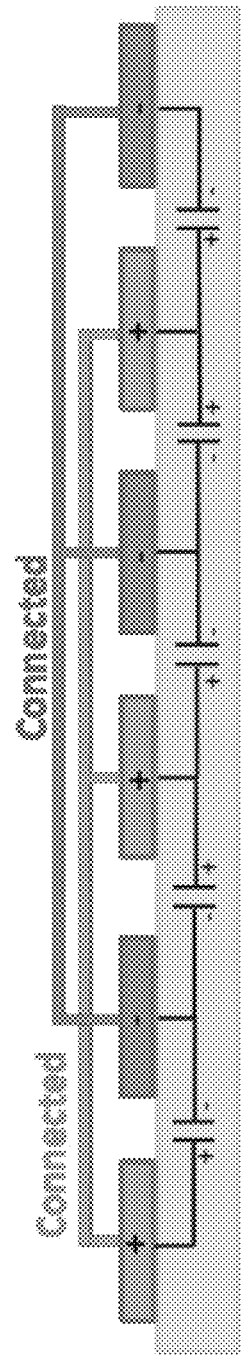

FIGS. 13A and 13B each show cross-sectional views of one or more capacitor structures formed from top electrodes across the thin film layer (e.g., as shown, as applicable, in 7, 9, 10, and 11), in accordance with an illustrative embodiment. In FIG. 13A, the capacitor structure is formed over a distance g (1302) in a lateral configuration. In FIG. 13B, the capacitor structure is formed across a set of the interdigitated fingers (e.g., of FIGS. 11 and 12).

Figure 14:
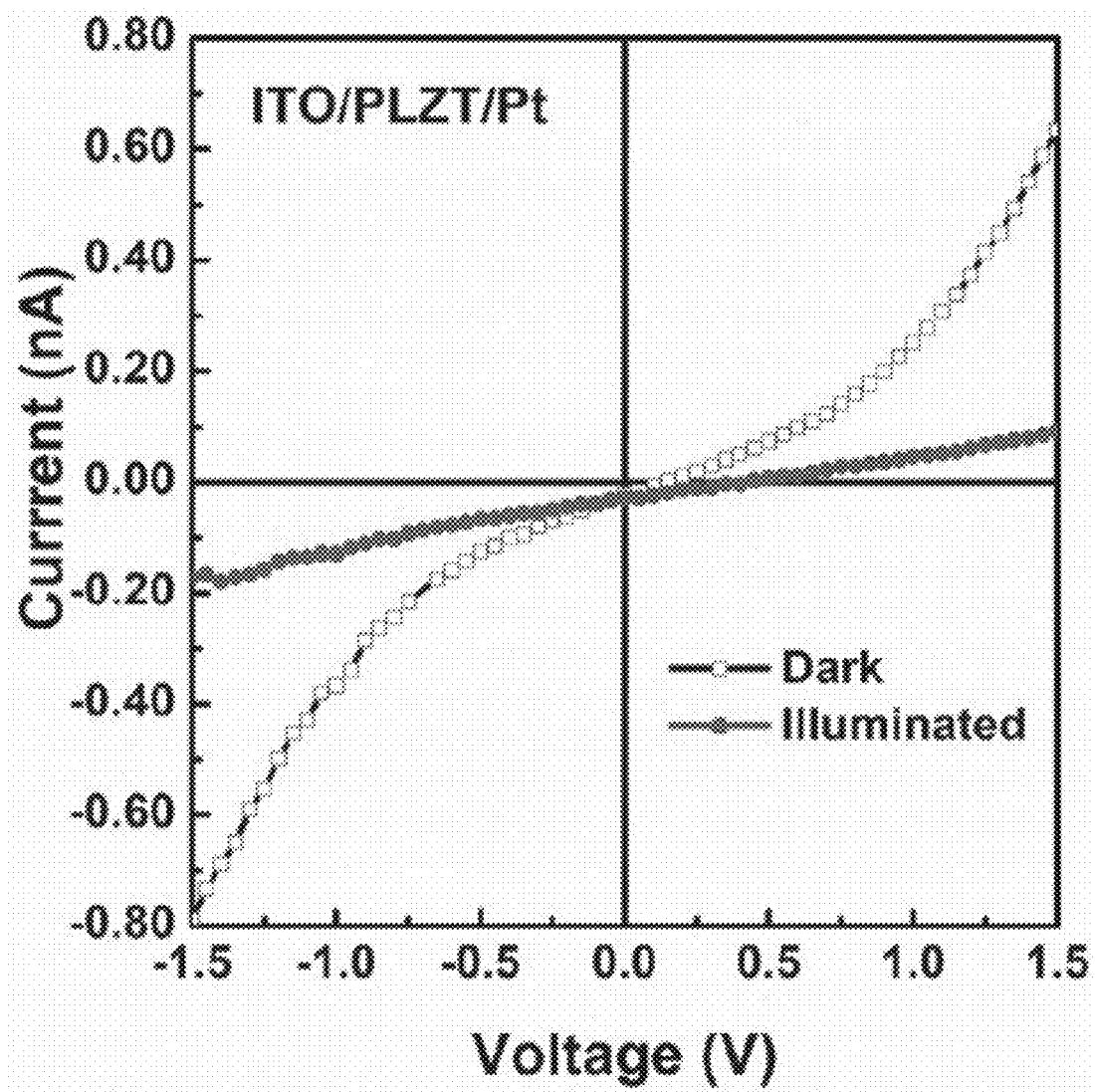
FIG. 14 is a diagram showing a current-voltage characteristic of the apparatus of FIG. 11, in particular, the dark and illuminated current voltage curve, in accordance with an illustrative embodiment.
Figure 15:
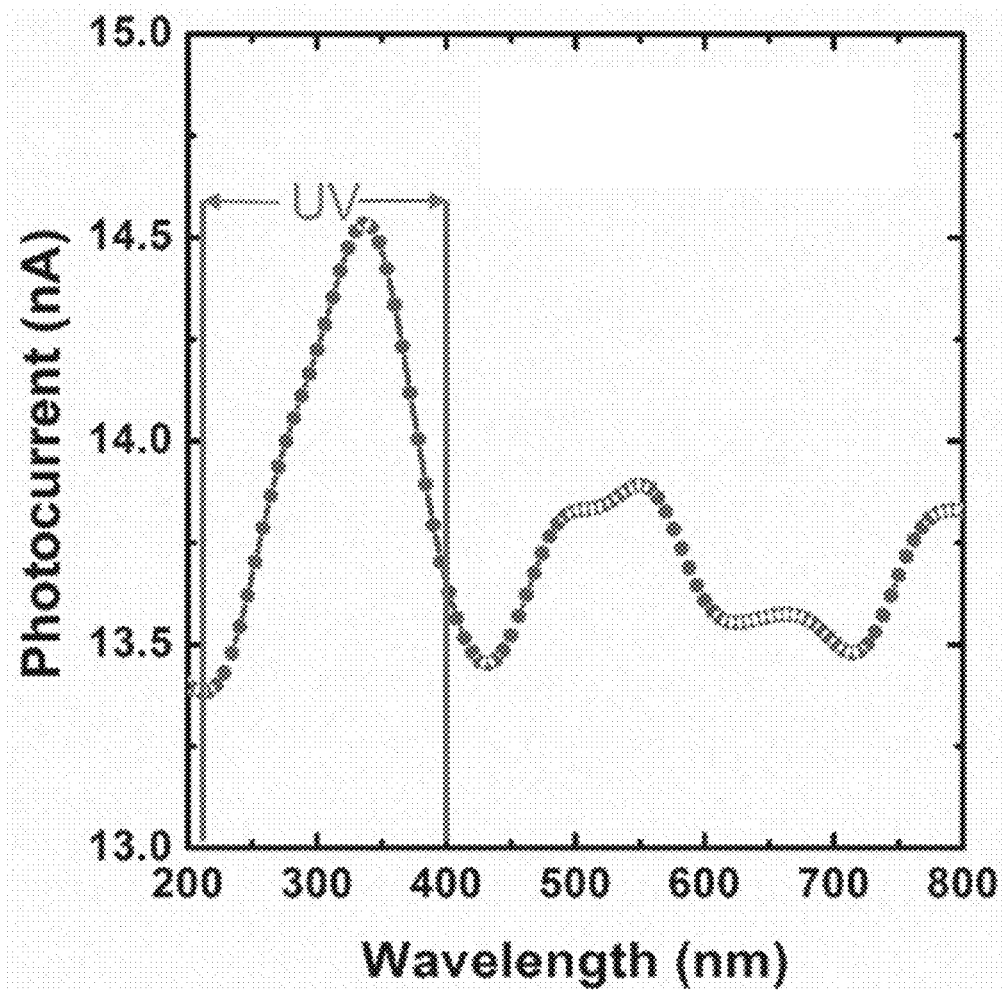
FIG. 15 is a diagram showing a photocurrent response curve as a function of wavelength.

FIG. 14 is a diagram showing a current-voltage characteristic of the apparatus 100 of FIG. 11 in particular, the dark and illuminated current voltage curve, in accordance with an illustrative embodiment. FIG. 15 is a diagram showing a photocurrent response curve as a function of wavelength. As shown in FIG. 15, the apparatus 100 is operable, and highly sensitive, over the UV wavelength ranges (e.g., "UV-A" at about 315 nm to about 400 nm wavelength; "UV-B" at about 280 nm to about 315 nm wavelength). A maximum photocurrent of about 14.5 nA is observed at about 350 nm.

Method of Fabrication

Figure 16:
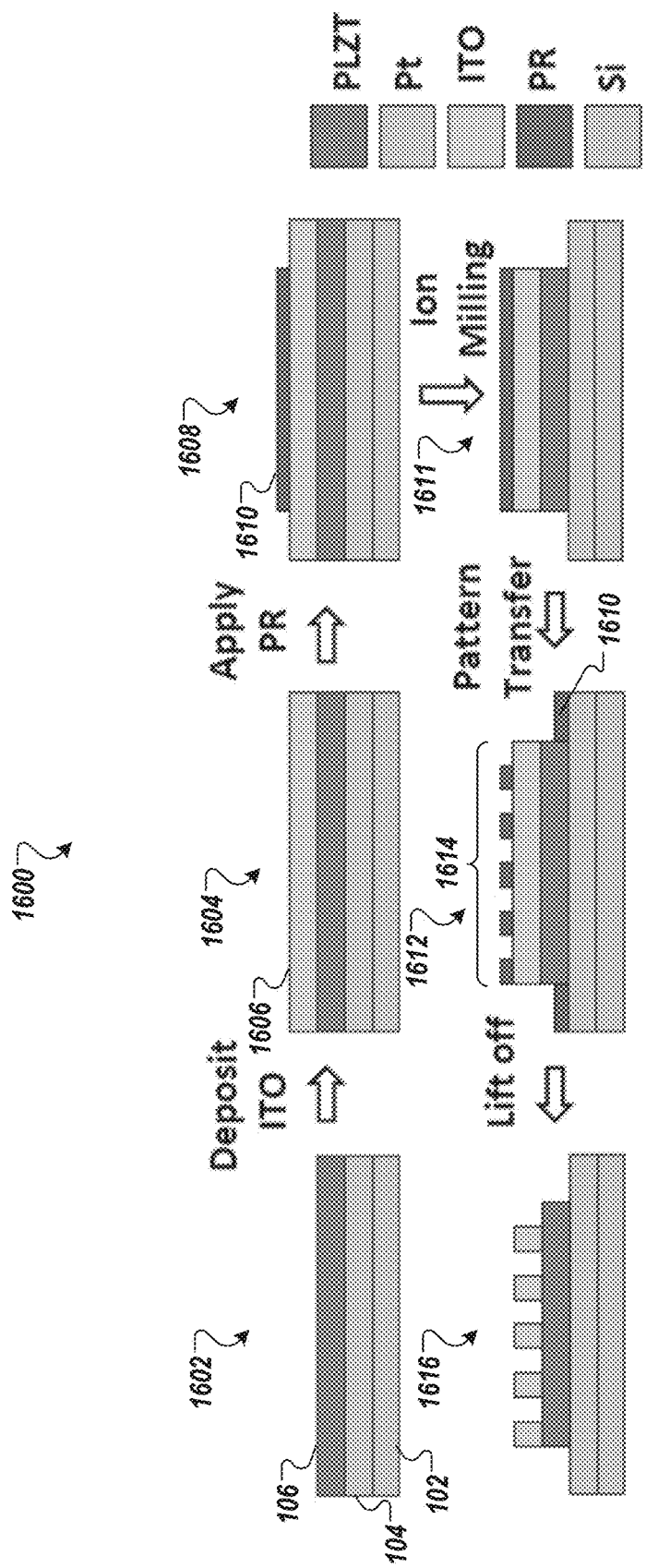
FIG. 16 is a diagram showing a process of fabricating the apparatus, e.g., of FIG. 1 (as a solar cell, UV sensor, and etc.), in accordance with an illustrative embodiment.

FIG. 16 is a diagram showing a process 1600 of fabricating the apparatus 100 of FIG. 1 (as a solar cell, UV sensor, and etc.), in accordance with an illustrative embodiment. As shown in FIG. 16, an initial structure, in step 1602, comprising the substrate 102, the bottom layer 104, and the thin film layer 106 is provided. In step 1604, a layer of ITO (1606) is deposited to the initial structure 1602 to form an ITO layered structure. In step 1608, a layer of photo-resist (1610) is applied to the ITO layer 1606, and ion milling process is performed (in step 1611) to generate a pattern 1614 in the photo-resist layer (1610). In step 1616, the exposed portion of the ITO layer 1606 is etched and then the photo-resist layer is removed.

Figure 17A:
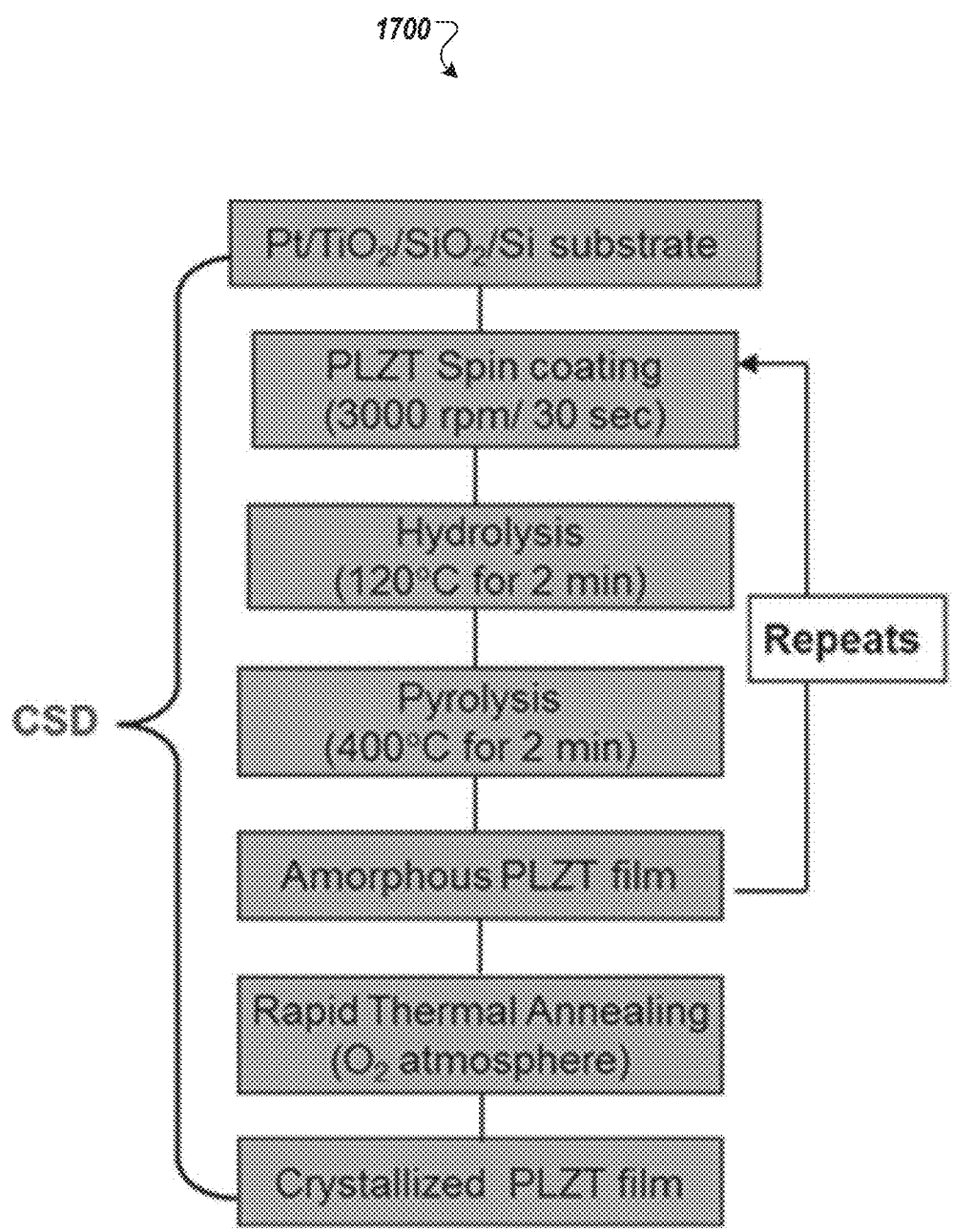
FIG. 17A is a diagram showing a fabrication method for the thin film layer, in accordance with an illustrative embodiment.

FIG. 17A is a diagram showing a fabrication method 1700 for the thin film layer, in accordance with an illustrative embodiment. The method 1700 includes generating a PLZT solution, e.g., using a metal organic decomposition (MOD) method. Precursors including Pb and La acetates, Zr-propoxide, and Ti-butoxide are used with 2-Methoxyethanol solvent. The PLZT thin film is formed, for example, with a chemical solution deposition (CSD) method. Additional description of the fabrication method for the PLZT thin film is provided in Harshan et al., "Effect of Annealing on Ferroelectric Properties of Lanthanum Modified Lead Zirconate Titanate Thin Films," Integrated Ferroelectrics, Vol. 130, pp. 73-83 (2011), which is incorporated by reference herein in its entirety.

Figure 17B:
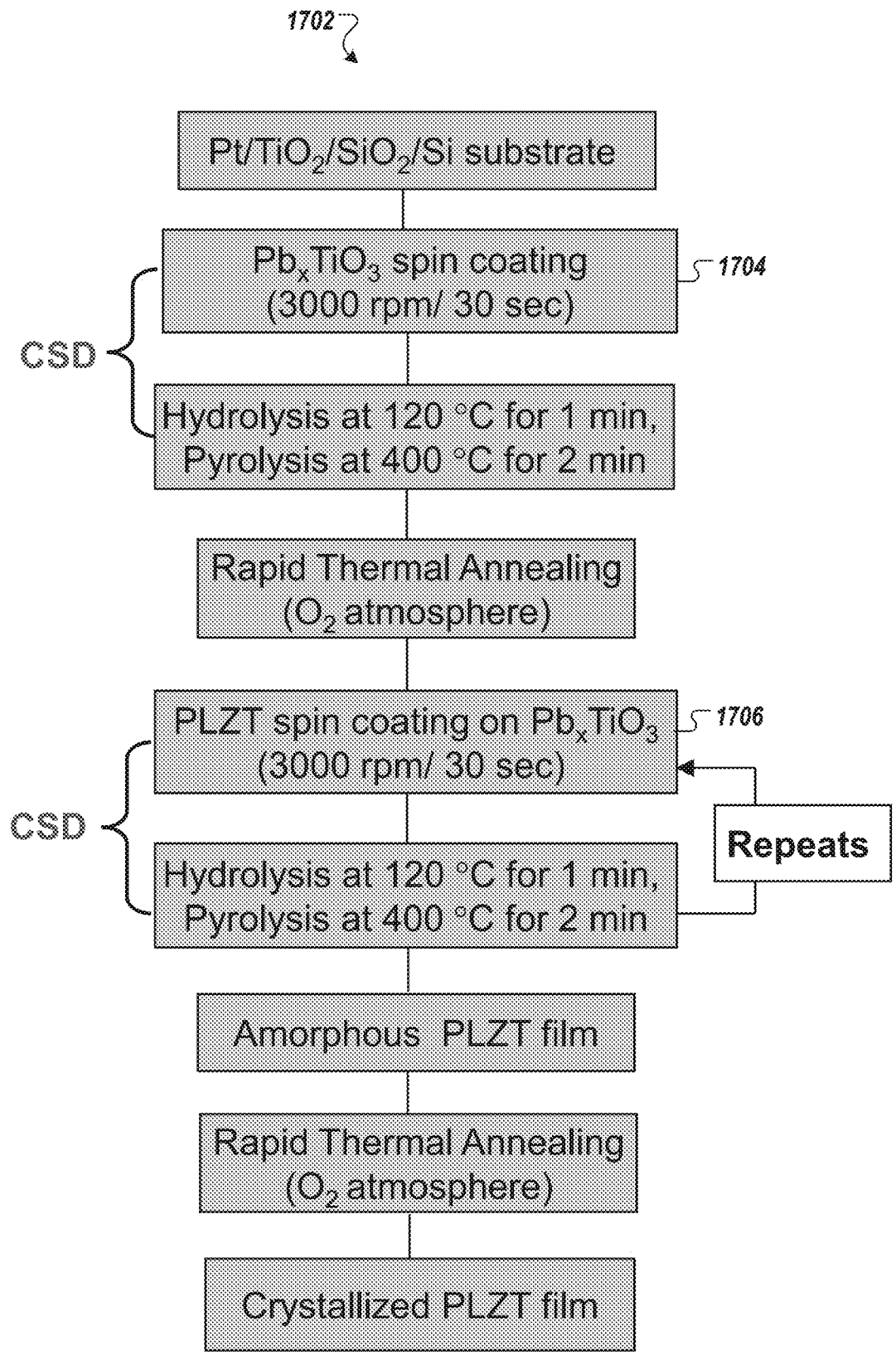
FIG. 17B is a diagram showing a fabrication method for the thin film layer with a seed layer, in accordance with an illustrative embodiment.

FIG. 17B is a diagram showing a fabrication method 1702 for the thin film layer with inclusion of a seed layer, in accordance with an illustrative embodiment. The method is a modification to the chemical solution deposition method as described in relation to FIG. 17A, and further includes first spin coating (step 1704) the seed layer material, e.g., $Pb_x$-$TiO_3$, onto the substrate (e.g., $Pt/TiO_2/SiO_2/Si$) and processing the seed layer prior to spin coating (step 1706) the PLZT solution on the formed seed layer material and processing the PLZT layer as, for example, described in relation to FIG. 17A.

Ferroelectric UV Indexing Sensor for Skin Care Application

Figure 18:
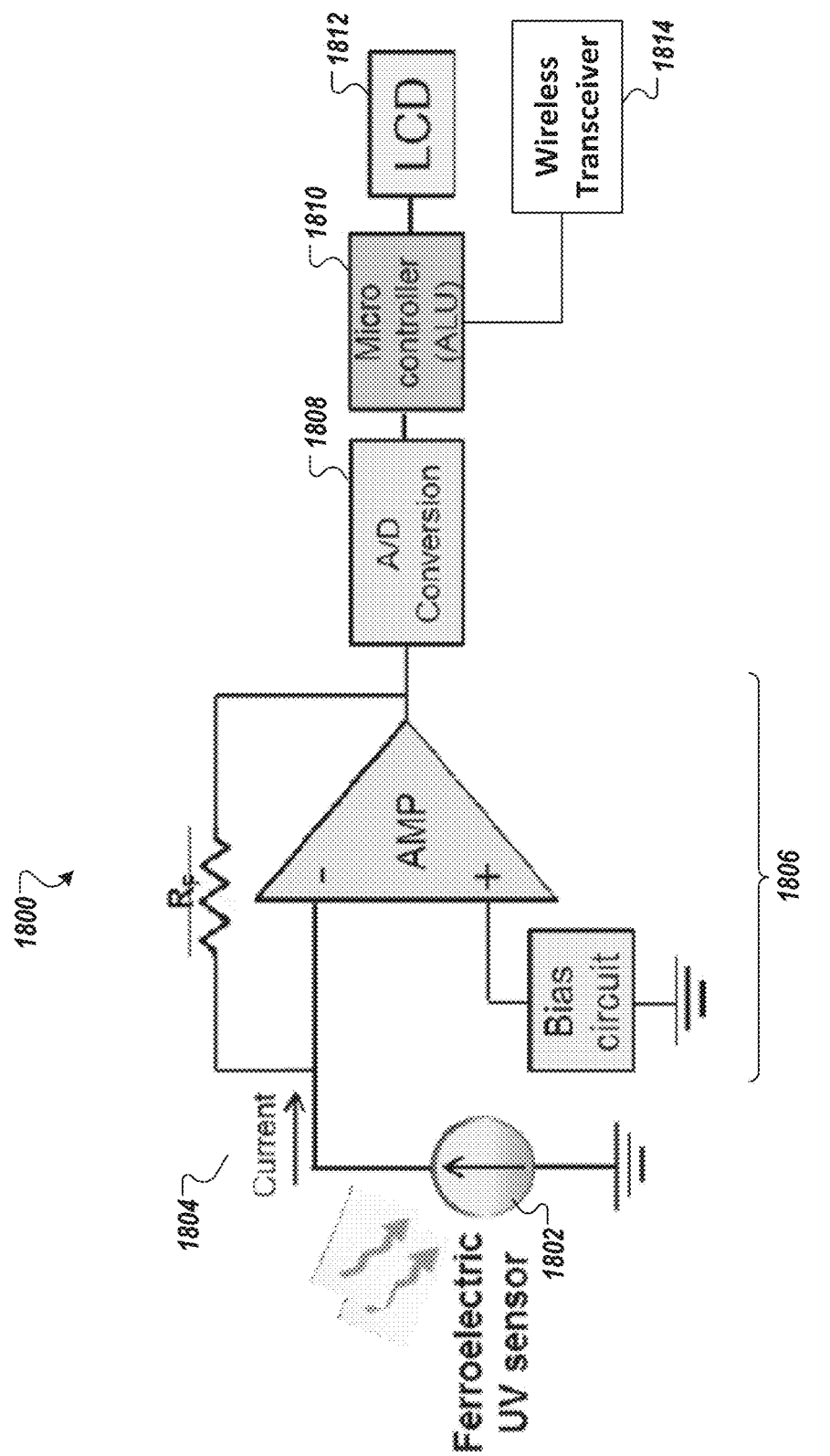
FIG. 18 is a schematic of an example UV indexing sensor system (e.g., for skin-care application) that uses the apparatus, in accordance with an illustrative embodiment.

FIG. 18 is a schematic of an example UV indexing sensor system 1800 (e.g., for skin-care application) that uses the apparatus 100, in accordance with an illustrative embodiment. The system 1800 includes a ferroelectric UV sensor 1802 configured to output an electric current 1804 corresponding to a measured UV exposure. Notably, the ferroelectric UV sensor 1802 is sensitive to UV-A and UV-B (as well UV-C) (e.g., as shown in FIG. 15). The output of the ferroelectric UV sensor 1802 is amplified and digitized. In FIG. 18, an amplifier circuit 1806 is shown along with an analog-to-digital conversion (ADC) circuit 1808. The output of the ADC circuit 1808 is received by a microcontroller 1810 configured to process the digitized signal and present a UV index value on a display 1812 (shown as "LCD" 1812). Display 1812 includes OLED (organic light emitting display) panels, and the likes. Other types of processor or controller may be used. A processor can be microcontrollers, microprocessors, or logic circuits such as ASICs (Application Specific Integrated Circuit), CPLDs (Complex Programmable Logic Device), FPGA (Field Programmable Gate Array), or other programmable logic integrated circuits. In some embodiments, a processor is configured to execute instruction stored in a memory of the device.

In some embodiments, the current output flows over a sensing load to facilitate sensing as a voltage.

In some embodiments, the LCD is mounted to a wearable device such as a watch having a wrist strap, an attachable pin, a chain (e.g., as a necklace), a bracelet, or an anklet. In some embodiments, the system 1800 is embedded, or fastened, in an article of clothing (e.g., a shirt, a hat, sunglasses, spectacles etc.).

Referring still to FIG. 18, in some embodiments, the system 1800 includes a wireless transceiver 1814. As shown in FIG. 18, in this example, the wireless transceiver 1814 is coupled to the electronic circuitry (e.g., microcontroller 1810) and is configured to transmit, over a communication channel, the generated index parameter to another computing device (not shown). In some embodiments, the transmission is over a near-field communication channel (e.g., Bluetooth, Wi-Fi, infrared, and the like) to facilitate presentation of the UV index data to a person, e.g., on a portable computing device and portable computing watch) or over a combination of near-field and far-field communication channel to store, e.g., in the cloud. A cloud-based application may send notification and alerts based on the measured UV index and/or corresponding exposure risk level.

FIG. 19 is a table showing example UV index levels from the measured output of the ferroelectric UV sensor 1802, in accordance with an illustrative embodiment. As shown, the UV index levels may be tiered based on sensed output of the ferroelectric UV sensor 1802. The UV index levels may include a first tier (1902—having a UV index of 0-2.9), a second tier (1904—having a UV index of 3-5.9), a third tier (1906—having a UV index of 6-7.9), a fourth tier (1908—having a UV index of 8.0-10.9) and a fifth tier (1910—having a UV index of greater than 11). Each UV index tiers may be mapped to an exposure risk level.

Figure 20:
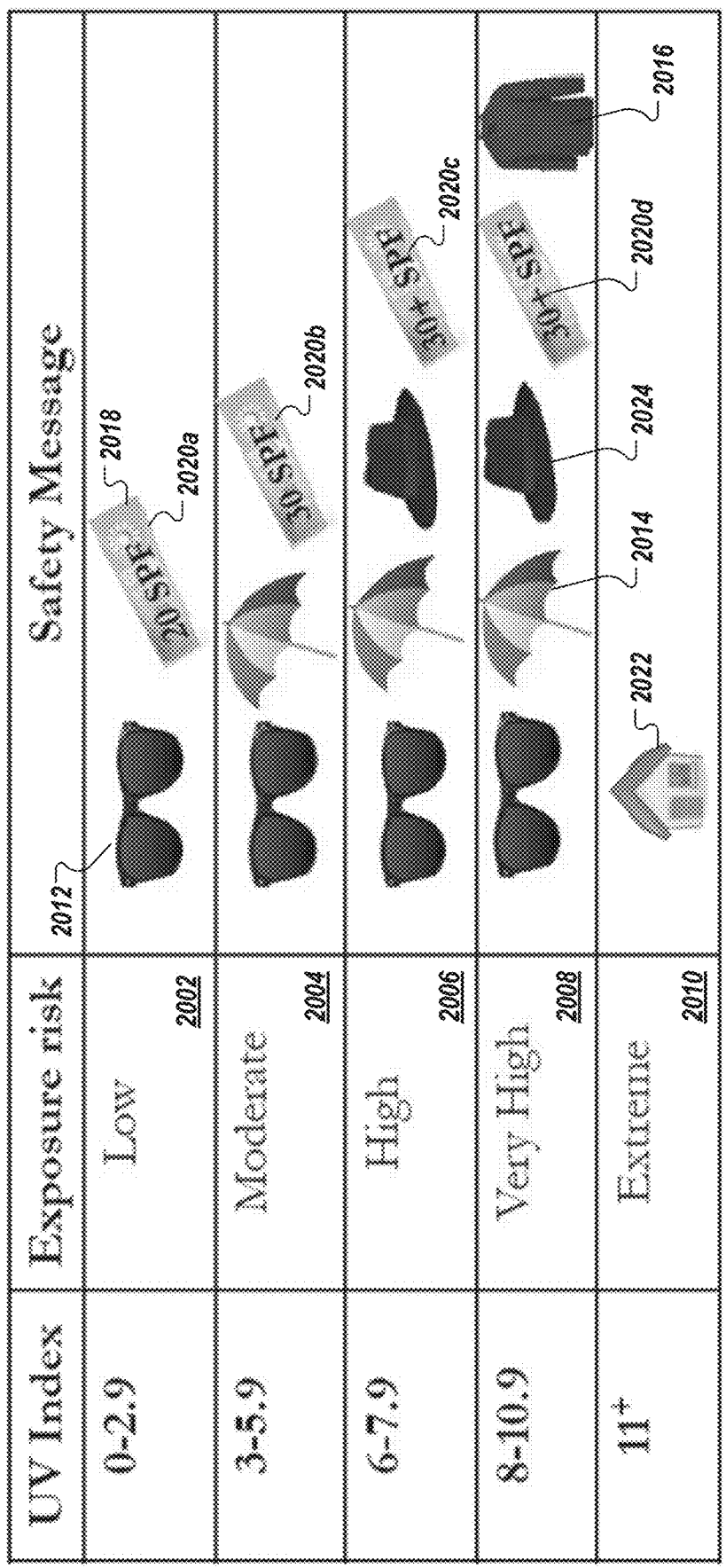
FIG. 20 is a diagram illustrating an example exposure risk level based on the measured output of the ferroelectric UV sensor, in accordance with an illustrative embodiment.

FIG. 20 is a diagram illustrating an example exposure risk level based on the measured output of the ferroelectric UV sensor 1802, in accordance with an illustrative embodiment. In FIG. 20, a UV index between about 0 and 2.9 is characterized as a low exposure risk (2002); a UV index between 3 and 5.9 is characterized as a moderate exposure risk (2004); a UV index between 6.0 and 7.9 is characterized as a high exposure risk (2006); a UV index between 8.0 and 10.9 is characterized as a very high exposure risk (2008); and a UV index higher than 11 is characterized as an extreme exposure risk (2010). Other UV index values and associated exposure risk levels may be used.

Referring still to FIG. 20, in some embodiments, the UV safety message is presented as icons having an associated meaning to the message (e.g., an icon 2012 indicating that eye protection is desired; an icon 2014 indicating that shading is desired; an icon 2016 indicating that protective clothing is desired; an icon 2018 indicating that sunscreen and the like is desired; an icon indicating a degree of sunscreen rating (e.g., 2020a, 2020b, 2020c, 2020d) is desired; an icon 2022 indicating that shelter is desired; an icon 2024 indicating the additional head protection is desired, among others). Other types of messages maybe used. For example, in some embodiments, a UV safety message may be presented based on the measured UV index via the LCD or display. In some embodiments, the UV safety message may be presented as text (e.g., indicating whether eye protection may be desired, whether shading may be desired, whether protective clothing may be desired, whether sunscreen and the like may be desired, a degree of sunscreen rating may be desired, and whether shelter may be desired). In some embodiments, the UV safety alert is a generated as audio message. In some embodiments, the UV safety alert is selectable, via a user interface, by the user with regard to the type of notification presented, the format of the presentation, the means of the notification being provided or generated, among others.

In some embodiments, the processor, is configured, via instructions, to monitor the sensed UV sensor 1802 and to cause a reminder message to be transmitted to the user. The reminder message, in some embodiments, includes a remaining time for safe exposure. In some embodiments, when the safe exposure time is passed or approaching, the processor is configured, via the instructions, to provide a reminder and an alert to the user, e.g., to seek shading or additional protection.

In some embodiments, the processor is configured, via instructions, to interrogate a user for a skin type. Based on the information entered by the user, the processor, via the instructions, can cause a display of UV hazards according to skin type and sensitivity, e.g., so as to provide safe exposure time which will be dependent on skin type and present UV index. In some embodiments, the processor, via the instructions, can present via the display selectable option of selecting a format (icon, text or audio) to receive the message.

Figure 21:
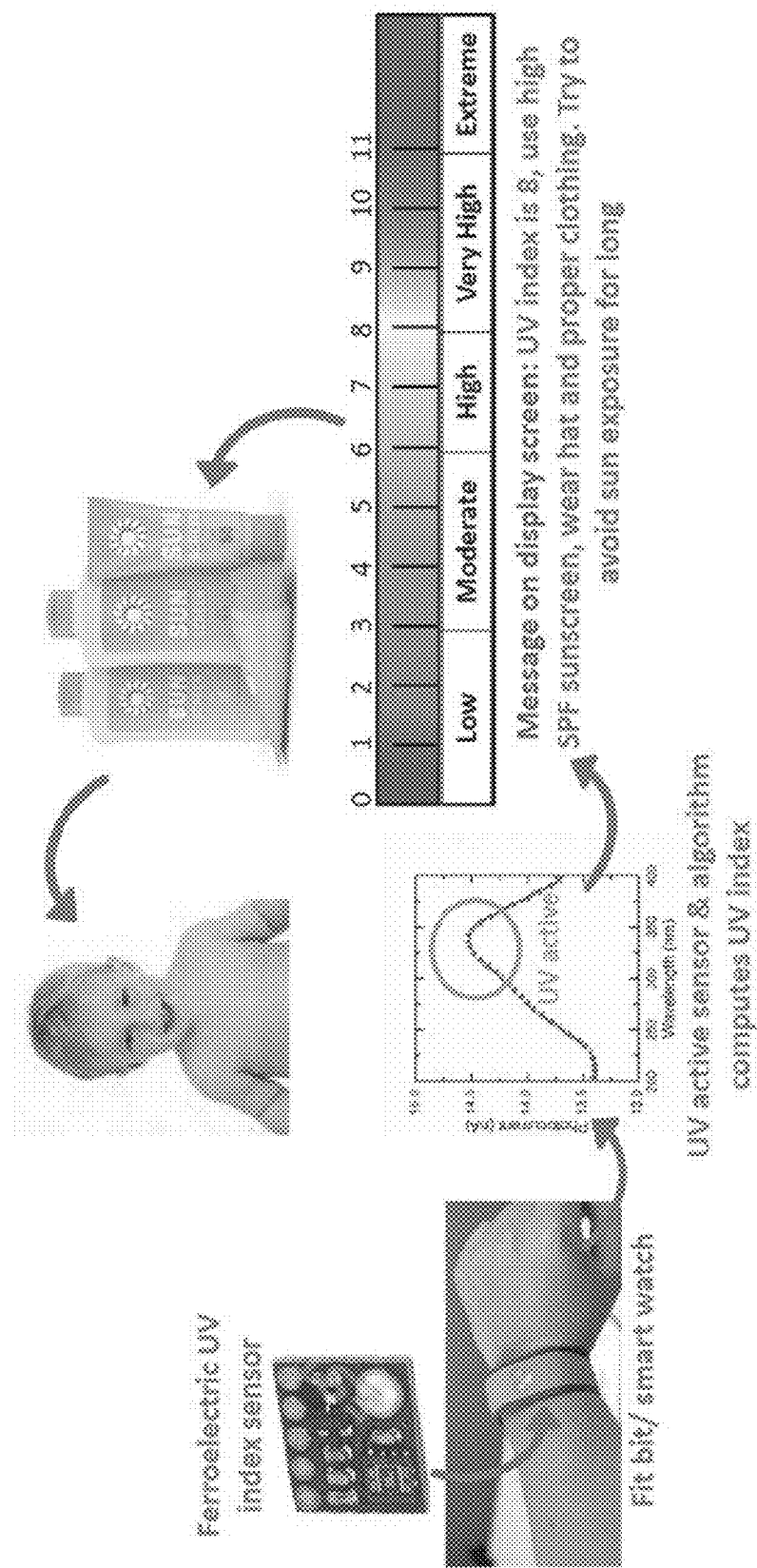
FIG. 21 shows an example application of a UV index sensor, in accordance with an illustrative embodiment.

FIG. 21 shows an example application of a UV index sensor, in accordance with an illustrative embodiment.

Real Time UV Monitoring for Tracking and Maintaining Required Vitamin D Dosage

The section of the disclosure relates to the use of such sensors made from lanthanum-doped lead zirconate titanate (PLZT) thin-film-based system, among others, e.g., for use in the real-time monitoring of ultraviolet radiation exposure for health care applications, in particular ultraviolet B radiation, to track Vitamin D dosage.

It is noted that Vitamin D deficiency has become a global health problem—more than a billion people worldwide are reported to be deficient in Vitamin D. In the United States, approximately 85% of the people have been reported in some studies to have some form of Vitamin D deficiency. Vitamin D has a role of helping with the absorption of calcium in the human body, which is essential for bone health and the maintenance of the skeleton, and Vitamin D deficiency has been reported to be associated or linked with autoimmune diseases, including rheumatoid arthritis (RA), systemic lupus erythematosus (SLE), inflammatory bowel disease (IBD), multiple sclerosis (MS), type 1 diabetes (T1DM), among others.

Vitamin D can be formed endogenously when sunlight strikes the skin. One form of Vitamin D, Vitamin D3 (cholecalciferol), is synthesized in the skin by the reaction of 7-dehydrocholesterol with short-wave ultraviolet B ("UVB") radiation present in sunlight. While direct exposure to sunlight can be beneficial to the treatment of Vitamin D deficiency, overexposure to UV radiations can be harmful in causing sun burn and can have chronic results associated with premature aging of the skin, suppression of the immune system, damage to the eyes, and skin cancer.

Treatment for Vitamin D deficiency often includes Vitamin D supplements that can be injected into the blood stream or taken orally. In severe cases of Vitamin D deficiency, blood tests are periodically conducted to monitor Vitamin D levels in the body.

Indeed, monitoring of direct ultraviolet B (UVB) radiation exposure by a person via a system having a sensor (such as Lanthanum doped lead zirconate titanate (PLZT) thin-film sensors or other ferroelectric-based sensors) sensitive to UVB radiation would beneficially provide current real-time dosage information associated with Vitamin D production by the person as well as real-time indication of safe exposure and/or harmful exposure to current UVB radiation conditions.

Figure 22:
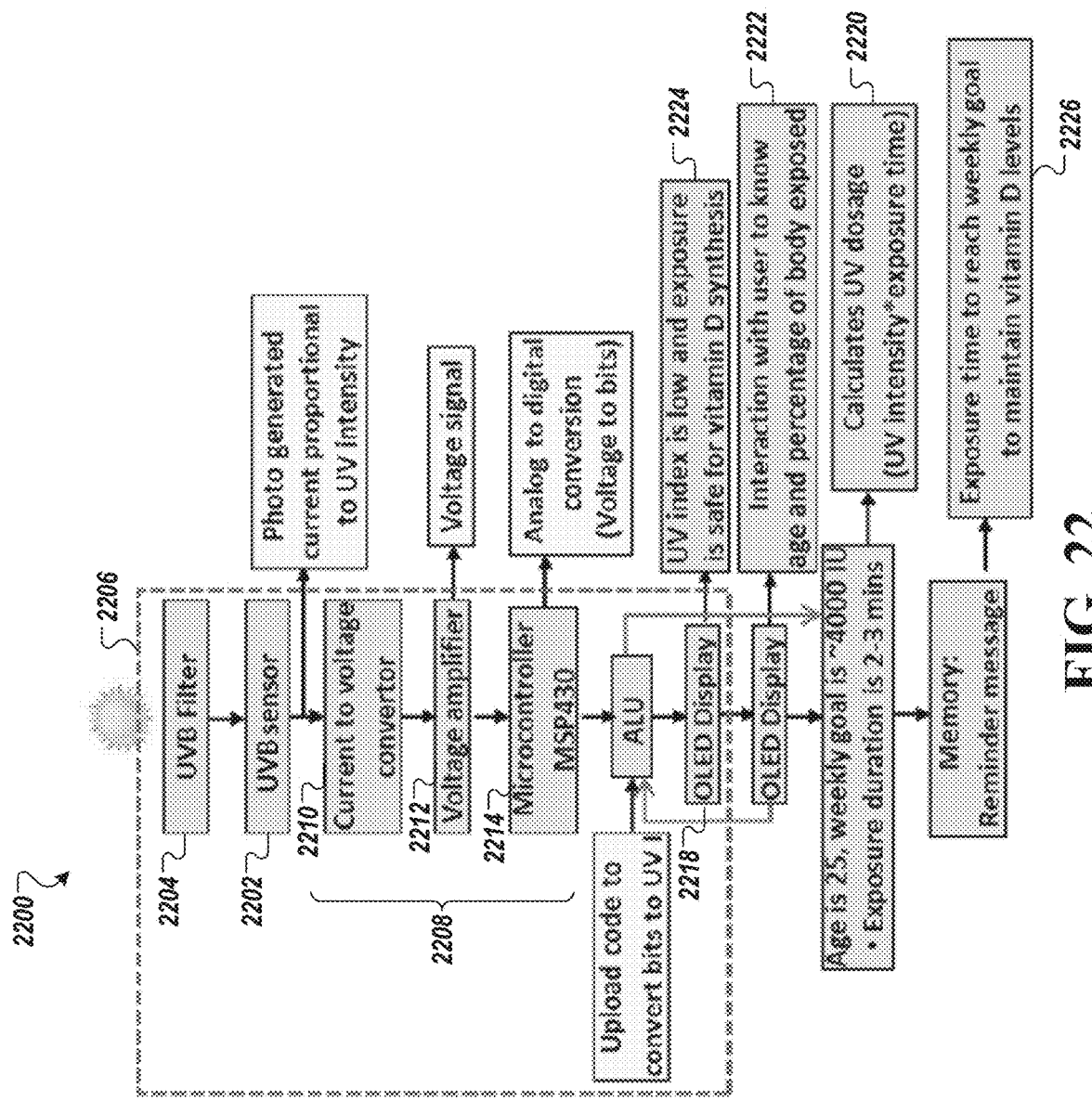
FIG. 22 is a diagram of an example system according to the present disclosure that monitors and/or tracks direct ultraviolet B (UVB) radiation exposure by a person to provide real-time Vitamin-D dose production information, in accordance with an illustrative embodiment.

FIG. 22 is a diagram of an example system 2200 according to the present disclosure that monitors and/or tracks direct ultraviolet B (UVB) radiation exposure by a person to provide real-time Vitamin-D dose production information, in accordance with an illustrative embodiment. The system 2200 includes an UVB sensor 2202 sensitive to UVB radiation, such as a ferroelectric-based photodiode, e.g., as those described herein. In some embodiments, the UVB sensor 2202 is based on the UV sensor 1802, as described for example in relation to FIG. 18, or the apparatus 100 as described for example in relation to FIGS. 1-17, among others. In some embodiments, the ferroelectric-based photodiode comprises a $PbZr_{1-x}Ti_xO_3$-based device or a $(Pb_{1-y}La_y)(Zr_xTi_{1-x})O_3$-based device, where $0 \leq x \leq 1$ (such as 0.5) and $0 \leq y \leq 0.1$ (such as 0.05). In some embodiments, the ferroelectric-based photodiode comprises a Lanthanum doped lead zirconate titanate (PLZT) thin-film such as $Pb_{0.95}La_{0.5}Zr_{0.54}Ti_{0.46}O_3$.

Short-wave ultraviolet radiation (UVB radiation) may exhibit different changes in intensity as compared to long-wave ultraviolet radiation (UVA radiation) due to different environment conditions, for example, that are caused by different cloud coverage, weather condition, and outdoor condition and/or structures. Indeed, measurement of UVB radiation via sensors sensitive to this range of the electromagnetic spectrum will provide a more accurate and direct assessment and/or estimate of endogenous production of Vitamin D as compared to the use of sensors that measure UVA radiation.

In other embodiments, an UVA sensor is used to provide measurements of UVA radiation levels to which estimates of UVB radiation levels can be derived therefrom.

As shown in FIG. 22, in some embodiments, the UVB sensor 2202 is coupled to short-wave ultraviolet-transparent filter 2204 configured to allow UVB radiation to pass through. The ultraviolet-transparent filter 2204 can be glass, crystals, or any other material that does not substantially attenuate or substantially block the transmission of UVB radiation. The ultraviolet-transparent filter 2204 can be integrated into the UVB sensor 2202, or it can be a component that is separately integrated into a system housing 2206 having the UVB sensor 2202. In some embodiments, the ultraviolet-transparent filter 2204 is configured to substantially block long wave ultraviolet radiation (i.e., UVA radiation).

In some embodiments, the apparatus includes a substrate (e.g., a $TiO_2/SiO_2/Si$ Substrate), a bottom layer (e.g., Platinum bottom contact), a thin film layer of PLZT comprising a Lanthanum doped lead zirconate titanate (PLZT) thin-film material (e.g., $Pb_{0.95}La_{0.05}Zr_{0.54}Ti_{0.46}O_3$), and an array of top electrodes comprising an ITO top contact. In some embodiments, the bottom layer and the top electrodes each forms back-to-back Schottky contacts with the thin film layer. The Schottky barriers formed at the interfaces between each of the thin film layer and the electrodes create polarization independent interface electric field. Other ferroelectric-based photodiodes can be used including those discussed herein.

The UVB sensor 2202 is further coupled to a signal processing stage and analog-to-digital conversion stage (collectively shown as 2208). In some embodiments, when the UVB sensor 2202 is a photodiode that outputs electric current levels corresponding to the intensity of UVB radiation exposure by the sensor 2202, the signal processing stage includes a current-to-voltage conversion circuit 2210 (e.g., a transimpedance amplifier circuit, a resistive network, etc.) that converts the current output of the UVB sensor 2202 to a voltage output. The signal processing stage includes, in some embodiments, a voltage amplifier 2212 configured to amplify the voltage prior to analog-to-digital conversion. In FIG. 22, the voltage amplifier 2212 is coupled to a microcontroller 2214 having a processor and an analog-to-digital conversion input. An example of the microcontroller 2214 that can be used is the MSP430 family microcontroller manufactured by Texas Instrument (Dallas, Tex.). The MSP430 family microcontroller is a self-contained low-cost and low-power microcontroller having integrated ferroelectric-based RAM and integrated static RAM (collectively referred to as memory), integrated sigma delta analog-to-digital converter, general purpose IOs, bus IOs, and/or other peripheral components.

Other microcontrollers and circuitries for signal processing and analog-to-digital conversion can be used. In some embodiments, the various subcomponents described herein can be implemented in field-programmable gate arrays (FPGAs), complex programmable logic devices (CPLDs), application-specific integrated circuits (ASICs), and/or other custom digital or mixed-signal circuitries.

To estimate the endogenous Vitamin D production or the estimated remaining amount of Vitamin D dosage production, the processor (e.g., of the microcontroller 2214) is configured, via instructions, to accumulate the measured values of the UVB sensor 2202 and to store that accumulated value in the system's memory. The measured values of the UVB sensor 2202, in some embodiments, can be stored as a measured UV intensity or a value associated therewith. The accumulation may be performed, in some embodiments, by updating a counter value (i.e., a total measured UV intensity) using each measured UV intensity sampled from the signal of UVB sensor 2202 as the measured UV intensity is sampled. In other embodiments, each measured intensity value is stored in memory and then accumulated when the accumulated information is requested or triggered to be displayed or notified to the user. The measurement can be sampled at a frequency of about 1 Hz or more. In some embodiments, the sampling frequency is less than 1 Hz (e.g., 0.2 Hz, 0.25 Hz, 0.5 Hz, 0.75 Hz, etc.). In some embodiments, the sampling frequency is about 10 Hz or more. In some embodiments, the sampling frequency is about 100 Hz or more.

In some embodiments, the raw measured UV intensity values (e.g., the raw ADC values) can be stored. In some embodiments, the raw measured UV intensity can be converted to other units (energy, measured current output of the sensor, measured voltage output of the current-to-voltage converter) for storage.

Referring still to FIG. 22, the system 2200 includes, in some embodiments, a display 2218 (shown as an OLED (organic light-emitting diode) display 2218) configured to provide a graphical indication of an estimated dosage value (2220) of Vitamin D obtained over a current day or over a current week and/or an estimated remaining amount value of Vitamin D dosage required or recommended for the current day or week. The presented information can be in exposure time (e.g., seconds, minutes, fractions of hours, hours, etc.) or in dosage produced (e.g., in IU/day or IU/week, mcg/day, mcg/week, etc.). In some embodiments, the presented units and information relating to estimated dosage value or estimated remaining amount value of Vitamin D dosage needed can be selectable by the user. The graphical indication can be a numerical value or an icon (or widget) having a representation of a gauge (e.g., a dial or a level, etc.). The graphical indication may present values of a parameter normalized to a pre-defined goal (i.e., determine required or recommended Vitamin D dosage).

Referring still to FIG. 22, in some embodiments, the system is configured to receive one or more inputs 2222 from the user to determine a required or recommended Vitamin D dosage for a given day or week. FIGS. 23 and 24 each shows a table of required or recommended Vitamin D dosage (for a given time period) for a person in which the required dosage can vary based on the person's age, the person's skin type or sensitivity, and the person's exposed body region or parts.

Specifically, FIG. 23 shows a table 2300 that includes different Vitamin D requirements or recommendations for a person based on the person's age, in accordance with an illustrative embodiment. As shown in FIG. 23, the Vitamin D requirements or recommendations (shown as 2302) for a person is generally the same for a male or for a female between the age of 6 months and 70 years. Newborns (e.g., 0-6 months old) (shown with 2304), people over 70 years old (shown with 2306), and pregnant women and new mothers (shown with 2308) may have different Vitamin D needs.

In some embodiments, the system is configured to receive, from the user, an input associated with the age or condition of the user. In some embodiments, the system is configured to prompt the user to answer questions associated with their age or condition (e.g., whether they are older than 70 years and/or whether they are pregnant or breast-feeding, or whether they are diagnosed as being Vitamin D deficient). Indeed, when the user selects these conditions, calculations for vitamin D requirements are adjusted accordingly. For example, if diagnosed with being Vitamin D deficient, a person would need more IU/day to make up the deficient levels.

In some embodiments, the system is configured to receive, from the user, a direct input associated with Vitamin D dosage requirement (e.g., daily requirement or weekly requirement).

Figures 24A, 24B:
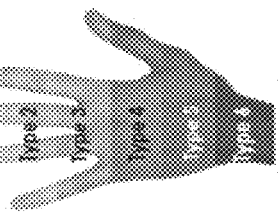
FIG. 24A shows a table that includes different exposure time requirements or recommendations to meet a daily dosage requirement in which the exposure time is varied based on the person's exposed body area and/or the persons' skin type or sensitivity, in accordance with an illustrative embodiment.
FIG. 24B shows a table of example skin type and sensitivity, in accordance with an illustrative embodiment.

FIG. 24A shows a table 2400 that includes different exposure time requirements or recommendations to meet a daily dosage requirement in which the exposure time is varied based on the person's exposed body area and/or the persons' skin type or sensitivity, in accordance with an illustrative embodiment. FIG. 24B shows a table of example skin type and sensitivity, in accordance with an illustrative embodiment.

As shown in FIG. 24A, the exposure time for a person requiring 400 IU/day dosage of Vitamin D (shown in columns 2402*a* 2402*b*) and for a person requiring 1000 IU/day dosage of Vitamin D (shown in columns 2404*a*, 2404*b*) can vary based on skin type (2406*a* and 2406*b*), or exposed body areas (shown in column 2406 based on percentage and shown in column 2408 based on corresponding set of exposed body areas). A look-up-table may be stored with similar information to that of table 2400, e.g., for the different types of skin types or sensitivity, for different dosage requirement, and for different exposed body area. The information can be stored in memory in other structure.

In some embodiments, multiple sets of exposure time information can be stored in the look-up-table or memory which each set include recommended or required exposure time for each of the different skin types or sensitivity. In this example, shown in FIGS. 24A and 24B, the skin type and sensitivity is segmented into 6 skin types, including skin type "1", skin type "2" (shown in FIG. 24A), skin type "3", skin type "4", skin type "5" (shown in FIG. 24A), and skin type "6", in which each skin type has an associated pigment coloration. Other levels for skin types or sensitivity can be used.

Further description of recommended or required exposure time for each of the different skin types or sensitivity is provided in O. Engelsen, "The Relationship between Ultraviolet Radiation Exposure and Vitamin D Status," Nutrients 2010, Vol 2(5), pp. 482-495 and Webb et al., "Ultraviolet exposure scenarios: risks of erythema from recommendations on cutaneous vitamin D synthesis," Adv. Exp. Med. Biol. Vol. 624, pp. 72-85 (2008), each of which is incorporated by reference herein in its entirety.

In some embodiments, a single set of exposure time information is stored along with scaling multipliers for each of the respective skin type or sensitivity. In some embodiments, the scaling multipliers can be stored as a pre-defined transfer function. To this end, the exposure time for a person with a given skin type or sensitivity can be determined or generated by multiplying the single set of exposure time information with a scaling multiplier corresponding to a selected skin type or sensitivity.

To provide an accurate exposure time estimates for the user, in some embodiments, the system is configured to receive, from the user, an input associated with the person's skin type or sensitivity. In some embodiments, the input can be received in a configuration pane of a graphical user interface of the system. In other embodiments, the input can be received in a prompted set of questions presented to the user during a setup sequence. In other embodiments, the input can be received in a website or user portal to which the input is then communicatively provided, e.g., over a network, from a server operatively coupled to the website or user portal to the system. In some embodiments, different skin colors can be presented to the user to aid the user in the selection of the user's skin type or sensitivity.

In some embodiments, the system is configured to estimate a value for the person's skin type or sensitivity, for example, based on an assessed skin fairness, assessed skin darkness, and/or assessed skin color tone as determined from a person photo or image. In some embodiments, the system is configured to receive an image from the user or to capture an image of the user and then using the received images to determine the skin type or sensitivity of the user for the purpose of determining required or recommended exposure time.

Referring still to FIG. 24A, the table 2400 includes exposure time for a person requiring 400 IU/day dosage of Vitamin D (shown in columns 2402a, 2402b) and for a person requiring 1000 IU/day dosage of Vitamin D (shown in columns 2404a, 2404b) in which the exposure time varies based on exposed body areas (shown in columns 2406 and 2408).

In some embodiments, the system is configured to receive an input from the user relating body regions or parts of the user that are, or would be, exposed to direct sunlight. As shown in column 2408, exposed body area can be segmented, for example, based on the face, the neck region, the hands, the arms, and the legs. Other body region can include the torso.

In some embodiments, a set of exposure time can be stored for each set of body part combination, for example, as shown in FIG. 24A. In other embodiments, a scaling value (e.g., a multiplier value) can be stored for each body region or part to which an aggregated exposed body area value can be determined from such scaling values and associated selection by the user. The aggregated exposed body value (e.g., in percentage) can be used to determine a required or recommended exposure time.

In some embodiments, the system can determine the user exposed body regions or parts based on one or more user's inputs associated with clothing. For example, the system can estimate that the face is exposed or not exposed based on an input from the user associated with whether the user is wearing a hat. The system can estimate that the arm is exposed or not exposed based on an input from the user associated with whether the user is wearing a long-sleeve or a short-sleeve upper body garment. The system can estimate that the legs are exposed or not exposed based on an input from the user associated with whether the user is wearing a long or a short lower body garment. In some embodiments, the system can present, e.g., via a display and/or user interface, a set of selectable tiers to the user associated with each combination of exposed body region or parts. In some embodiments, the system can present, e.g., via the display and/or user interface, a set of selectable exposed body regions or parts. In some embodiments, the system can estimate a set of exposed or not exposed body regions or parts based on assessed environment conditions, e.g., temperature, humidity, and weather conditions. The estimate may be presented to the user with a set of default values for the user to accept and/or to adjust.

In yet another embodiment, the system can determine a required or recommended exposure time without consideration of exposed or unexposed body areas. In some embodiments, an average exposed area is used. In other embodiments, a minimal value of the exposed or unexposed body areas is used to which the system can monitor or track UVB exposure for the user with respect to over-conservative requirement or recommendation of UVB exposure. This requirement can be adjusted based on seasonality information.

Referring back to FIG. 22, and as discussed in relation to FIG. 22, the system is configured to estimate and present a dosage value (2220) of Vitamin D obtained over a current day or over a current week and/or an estimated remaining amount value of Vitamin D dosage required or recommended for the current day or week. In some embodiments, to estimate a current dosage value (2220) of Vitamin D obtained for the day, the system maintains a counter of UVB dosage ($D_{obtained}$). In some embodiments, the UVB dosage can be determined by Equation 1.

$$D_{obtained} = \text{UVB intensity value} \times \text{exposure time} \quad \text{(Equation 1)}$$

in which $D_{obtained}$ is in units of milliWatt-second/cm$^2$ (or Joules/cm$^2$); UVB intensity value is expressed in units of mW/cm$^2$, and the exposure time is in units of seconds.

The estimated dosage value (2220) of Vitamin D obtained over a current day or over a current week can be stored, in some embodiments, as a time-series dataset as a historical profile for the user.

FIG. 25 shows a table 2500 that includes different calculated UVB dosage determined based on different values of exposure time to UVB radiation and on different values of UVB radiation intensity, in accordance with an illustrative embodiment. Specifically, table 2500 shows calculated UVB dosage, in Joules per cm$^2$ based on measured UVB radiation intensity of about 2 mW/cm$^2$ (2502); about 10 mW/cm$^2$ (2504); about 12 mW/cm$^2$ (2506); about 15 mW/cm$^2$ (2508); and about 20 mW/cm$^2$ (2510).

In some embodiments, the system can determine the estimated remaining amount value of Vitamin D dosage ($D_{remaining}$) required or recommended for the current day based on Equation 2.

$$D_{remaining} = D_{required} - (\Sigma V_{raw} * T_s) \quad \text{(Equation 2)}$$

in which $D_{remaining}$ is the estimated remaining amount of required or recommended UVB dosage for the current day expressed in seconds, $D_{required}$ is the required or recommended UVB dosage expressed in Joules/cm², $V_{raw}$ is the measured input of the sensor expressed in Watt/cm², and $T_s$ is the sampling time expressed in seconds. Other units and unit scales can be used.

Referring back to FIG. 22, the system in some embodiments is configured to further provide indication 2226 of estimated remaining amount of required or recommended UVB dosage for the current week. In some embodiments, a second counter is maintained for an estimated cumulated UVB dosage produced for the week. The required or recommended UVB dosage for the current week can be determined based on the required or recommended UVB dosage for the current day.

Referring back to FIG. 22, the system in some embodiments is configured to further provide indication 2224 of a current safe exposure to the direct sunlight or indicate a current harmful exposure to the direct sunlight. In some embodiments, the indication is a graphical output, via the display 2218, of a graphical icon indicating safe or unsafe conditions. The determination of current safe exposure or current harmful exposure, in some embodiments, is based on the current measured UVB intensity. For example, in some embodiments, the processor is configured to compare the current measured UVB intensity to a pre-defined threshold for safe exposure or a pre-defined threshold for unsafe exposure. In some embodiments, the pre-defined threshold for safe exposure or a pre-defined threshold can be fixed or it can vary based on factors such as the user's skin type or sensitivity.

In some embodiments, the system generates a current UV exposure index by comparing (e.g., via the processor or via digital circuitries) a parameter value derived from a last set of data values (e.g., one or more recently obtained data values, including or not including the last data value) of the plurality of data values received by the processor from the sensor to one or more UV threshold values, at least one of the one or more UV threshold values is associated with the current safe exposure to the direct sunlight or the current harmful exposure to the direct sunlight. In other embodiments, the system generates the current UV exposure index by comparing (e.g., via analog circuitries) a currently acquired signal of the sensor to one or more UV threshold signal levels, wherein at least one of the one or more UV threshold signal levels is associated with the current safe exposure to the direct sunlight or the current harmful exposure to the direct sunlight.

In some embodiments, the indication 2224 is an auditory alert or a vibratory alert that is associated with the current harmful exposure to the direct sunlight.

To this end, the exemplary system can provide information about a person's vitamin D dosage obtained from the sun exposure, keep a track of daily dosage, and warn the user when it is not safe to be exposed to the sun. The system can be used to bring awareness to the safe or recommended exposure time (for a given season, weather pattern, and geographic location) and a duration to UV radiations (specifically UVB radiation).

The system can help a person in naturally maintaining vitamin D levels via endogenous Vitamin D production and minimize the risk and likelihood of harmful effects from such exposure such as burns, activation of cancer cells, etc. In some embodiments, the system is used to augment or replace oral vitamin D dosage as a way to treat Vitamin D deficiency. In some embodiments, the system is used to help reduce the periodicity of monitoring Vitamin D levels in the body via blood tests.

Referring back to FIG. 22, the system can be configured as a wearable device or a hand-held device (such as smartphone or a standalone device). In some embodiments, the system 2200 is a component of, or a set of components in, a mobile electronic device. In other embodiments, the system 2200 is integrated or can operate with a smartphone or wearable device having a form of a watch, a hat, a headpiece, a neck piece, a neck band, a bracelet, a ring, an eye piece, an arm band (e.g., as part of a pendant, bracelet, clip, cocktail ring, fit bit, smart watch, etc. or be embedded in garments such as a hat, shirt, etc.)

In some embodiments, the system 2200 includes a wireless transceiver, which can be coupled to the processor and is configured to transmit, over a communication channel, to another computing device (not shown), the produced Vitamin D dosage or a parameter derived therefrom and/or a remaining exposure time to meet the required or recommended exposure time. In some embodiments, the transmission is over a near-field communication channel (e.g., Bluetooth, Wi-Fi, infrared, and the like) to facilitate presentation of the produced Vitamin D dosage or a parameter derived therefrom and/or a remaining exposure time to meet the required or recommended exposure time to the person, e.g., on a portable computing device and portable computing watch) or over a combination of near-field and far-field communication channel to store, e.g., in the cloud. A cloud-based application may send notification and alerts based on the measured UV index and/or corresponding exposure risk level and produced Vitamin D dosage.

Figure 26:
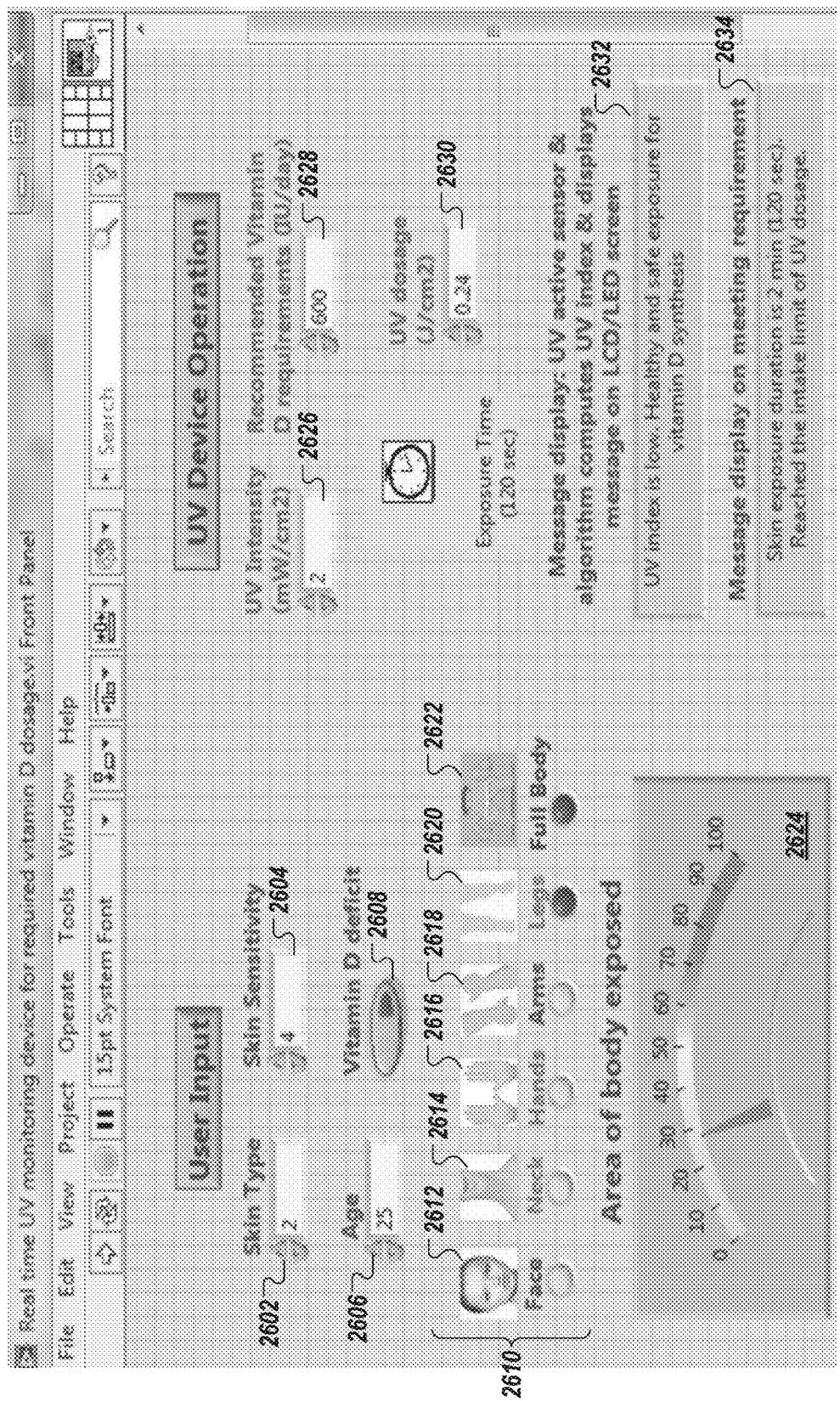
FIG. 26 is a screenshot of an example graphical user interface of the exemplary system to track and monitor Vitamin D dosage production, in accordance with an illustrative embodiment.

Example Experimental Test System for Real Time UV Monitoring of Required Vitamin D Dosage FIG. 26 is a screenshot of an example graphical user interface 2600 of the exemplary system 2200 to track and monitor Vitamin D dosage production as described herein, in accordance with an illustrative embodiment.

As shown in FIG. 26, the graphical user interface 2600 includes a first graphical input 2602 for the user to provide a selection of a skin type, a second graphical input 2604 for the user to provide a selection of skin sensitivity, a third graphical input 2606 for the user to provide the user's age, and a fourth graphical input 2608 for the user to provide status of whether the user has been diagnosed with Vitamin D deficiency. As discussed herein, in some embodiments, the input of the system 100 and associated with the first graphical input 2602, the second graphical input 2604, the third graphical input 2606, and the fourth graphical input 2608 can be received in an initial configuration pane of a graphical user interface of the system. It is noted that the first graphical input 2602 for the user to provide a selection of a skin type and the second graphical input 2604 for the user to provide a selection of skin sensitivity are directed to the same factor and only one selection is needed for the determination of the exposure time to meet the daily requirement or recommendation for Vitamin D dosage.

The graphical user interface 2600 further includes a set of selectable icons 2610 each associated with an exposed body region or part including a first icon 2612 associated with the face area, a second icon 2614 associated with the neck region, a third icon 2616 associated with the hand region, a fourth icon 2618 associated with the arm region, a fifth icon 2620 associated with the leg region, and a sixth icon 2622 associated with the torso region. In some embodiments, the input of the system 2200 and associated with the selectable icons 2610 can be presented for each selection by the user on a daily basis and based on each prolonged exposure anticipated by the user. To this end, accurate UVB dosage production can be determined based on exposed body area and UV intensity. The graphical user interface 2600 further includes a dial gauge output 2624 that presents area of body exposed as a percentile that is calculated based on inputs of the set selectable icons 2610.

The graphical user interface 2600 further includes a graphical output 2626 associated with a UV intensity measurement that is derived from a sensor measurement.

The graphical user interface 2600 further includes a graphical output 2628 associated with a determined recommended or required Vitamin D dosage as determined based on the inputs provided by the user (e.g., based on the user's age as provided to the input 2606).

The graphical user interface 2600 further includes a graphical output 2628 associated with a determined recommended or required Vitamin D dosage as determined based on the inputs provided to the user (e.g., based on the user's age as provided to the input 2606), for example, as discussed in relation to FIG. 23.

The graphical user interface 2600 further includes a graphical output 2630 associated with a determined UV dosage as determined based on the measured UV intensity and exposure time and based on the inputs provided to the user, including the exposed body regions or parts as provided to inputs 2610, for example, as discussed in relation to FIG. 24A.

The graphical user interface 2600 further includes a graphical output 2632 associated with a determined indication 2224 of a current safe exposure to the direct sunlight (e.g., assessed UV index is lower than 3) or indicate a current harmful exposure (e.g., assessed UV index is greater than 3) to the direct sunlight, for example, as described in relation to FIG. 22.

The graphical user interface 2600 further includes a graphical output 2634 associated with a determined indication that required or recommended exposure time has been met.

Discussion of Real Time UV Monitoring of Required Vitamin D Dosage

It is noted that few devices in the market are UV index sensors or Vitamin D trackers that has the capability of providing information about safe exposure time for obtaining Vitamin D dosage. In addition, the current devices in the market are often based on pure Silicon or compound semiconductor based materials such as SiC, GaN, InGaN, etc. These materials are difficult to fabricate and require vacuum deposition techniques, which adds to the overall cost of the development of the system. Further, the existing devices are either large or are not stand alone/wearable devices. Some of these devices may require GPS trackers to track the location to get information on UV index or can work only with smartphone apps. With that said, the system as described herein can nevertheless, in some embodiments, be used in systems with GPS trackers or with other types of UVB sensitive sensors, such as SiC-based (Silicon-Carbide-based) photodiode, a GaN-based (Gallium-Nitride-based) photodiode, an InGaN (an Indium-Gallium-Nitride-based) photodiode, an AlGaN (Aluminum-Gallium-Nitride-based) photodiode; a PbTiO$_3$-based photodiode, a BaTiO$_3$-based photodiode, a SrTiO$_3$-based photodiode, a Ba$_x$Sr$_{1-x}$TiO$_3$-based photodiode, a (1-x)BaTiO$_3$-(x)BiFeO$_3$-based photodiode, a PbZr$_{1-x}$Ti$_x$O$_3$-based photodiode, a (Pb$_{1-y}$La$_y$)(Zr$_x$Ti$_{1-x}$)O$_3$-based photodiode wherein 0≤x≤1 (such as 0.5) and 0≤y≤0.1 such as (0.05), a KNbO$_3$-based photodiode, a ZnO-based photodiode, a MgZnS-based photodiodes, a LaAlO$_3$-based photodiode, and a ZnMgO-based photodiode.

By using ferroelectric material such as PbZr$_{1-x}$Ti$_x$O$_3$-based device or a (Pb$_{1-y}$La$_y$)(Zr$_x$Ti$_{1-x}$)O$_3$-based device, where 0≤x≤1 (such as 0.5) and 0≤y≤0.1 (such as 0.05). In some embodiments or Lanthanum doped lead zirconate titanate (PLZT) thin-film such as Pb$_{0.95}$La$_{0.05}$Zr$_{0.54}$Ti$_{0.46}$O$_3$, the UVB sensor 2202 can still be fabricated on Si substrate, which is inexpensive, and can easily be integrated with CMOS technology. To this end, the system can be miniaturized and integrated with existing consumer electronics such as an iPod or other storage device so that a person can save and enjoy music while soaking in Vitamin D. As a further example, the Vitamin D tracker can be integrated into a heart rate monitor or a pedometer to allow an individual to maintain an account of their fitness routine at the same time in a single all-in-one device.

While the methods and systems have been described in connection with preferred embodiments and specific examples, it is not intended that the scope be limited to the particular embodiments set forth, as the embodiments herein are intended in all respects to be illustrative rather than restrictive.

As used herein, "computing device" may include a plurality of computers. The computers may include one or more hardware components such as, for example, a processor, a random access memory (RAM) module, a read-only memory (ROM) module, a storage, a database, one or more input/output (I/O) devices, and an interface. Alternatively and/or additionally, controller may include one or more software components such as, for example, a computer-readable medium including computer executable instructions for performing a method associated with the exemplary embodiments. It is contemplated that one or more of the hardware components listed above may be implemented using software. For example, storage may include a software partition associated with one or more other hardware components. It is understood that the components listed above are exemplary only and not intended to be limiting.

Figure 27:
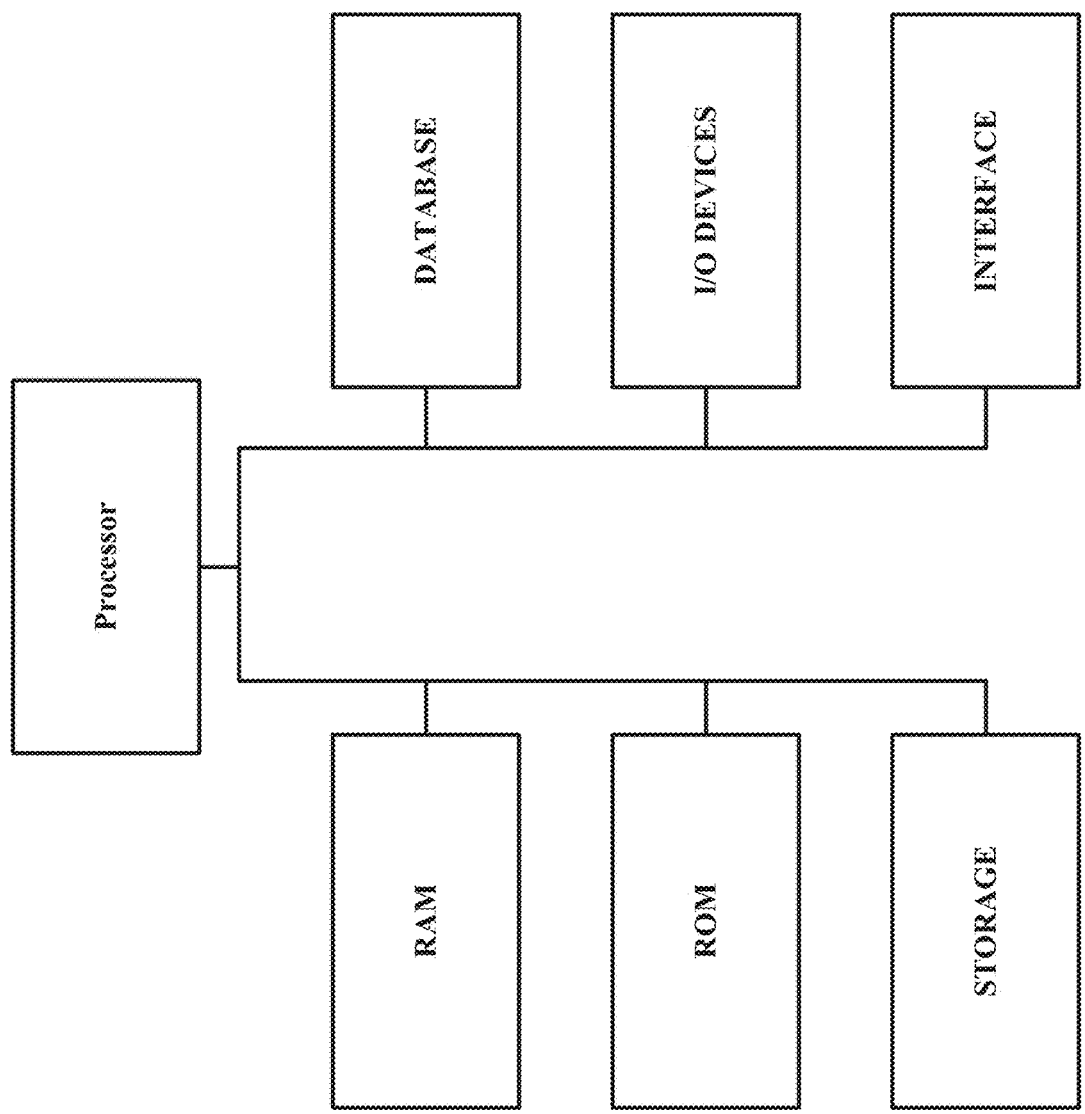
FIG. 27 shows an example computing device which can be used to perform operations associated with the processes described herein, in accordance with an illustrative embodiment.

FIG. 27 shows an example computing device which can be used to perform operations associated with the processes described herein, in accordance with an illustrative embodiment.

Processor may include one or more processors, each configured to execute instructions and process data to perform one or more functions associated with a computer for indexing images. Processor may be communicatively coupled to RAM, ROM, storage, database, I/O devices, and interface. Processor may be configured to execute sequences of computer program instructions to perform various processes. The computer program instructions may be loaded into RAM for execution by processor. As used herein, processor refers to a physical hardware device that executes encoded instructions for performing functions on inputs and creating outputs.

RAM and ROM may each include one or more devices for storing information associated with operation of processor. For example, ROM may include a memory device configured to access and store information associated with controller, including information for identifying, initializing, and monitoring the operation of one or more components and subsystems. RAM may include a memory device for storing data associated with one or more operations of processor. For example, ROM may load instructions into RAM for execution by processor.

Storage may include any type of mass storage device configured to store information that processor may need to perform processes consistent with the disclosed embodiments. For example, storage may include one or more magnetic and/or optical disk devices, such as hard drives, CD-ROMs, DVD-ROMs, or any other type of mass media device.

Database may include one or more software and/or hardware components that cooperate to store, organize, sort, filter, and/or arrange data used by controller 1320 and/or processor. For example, database may store hardware and/or software configuration data associated with input-output hardware devices and controllers, as described herein. It is contemplated that database may store additional and/or different information than that listed above.

I/O devices may include one or more components configured to communicate information with a user associated with controller. For example, I/O devices may include a console with an integrated keyboard and mouse to allow a user to maintain a database of images, update associations, and access digital content. I/O devices may also include a display including a graphical user interface (GUI) for outputting information on a monitor. I/O devices may also include peripheral devices such as, for example, a printer for printing information associated with controller, a user-accessible disk drive (e.g., a USB port, a floppy, CD-ROM, or DVD-ROM drive, etc.) to allow a user to input data stored on a portable media device, a microphone, a speaker system, or any other suitable type of interface device.

Interface may include one or more components configured to transmit and receive data via a communication network, such as the Internet, a local area network, a workstation peer-to-peer network, a direct link network, a wireless network, or any other suitable communication platform. For example, interface may include one or more modulators, demodulators, multiplexers, demultiplexers, network communication devices, wireless devices, antennas, modems, and any other type of device configured to enable data communication via a communication network.

Unless otherwise expressly stated, it is in no way intended that any method set forth herein be construed as requiring that its steps be performed in a specific order. Accordingly, where a method claim does not actually recite an order to be followed by its steps or it is not otherwise specifically stated in the claims or descriptions that the steps are to be limited to a specific order, it is no way intended that an order be inferred, in any respect. This holds for any possible non-express basis for interpretation, including: matters of logic with respect to arrangement of steps or operational flow; plain meaning derived from grammatical organization or punctuation; the number or type of embodiments described in the specification.

Throughout this application, various publications may be referenced. The disclosures of these publications in their entireties are hereby incorporated by reference into this application in order to more fully describe the state of the art to which the methods and systems pertain.

It will be apparent to those skilled in the art that various modifications and variations can be made without departing from the scope or spirit. Other embodiments will be apparent to those skilled in the art from consideration of the specification and practice disclosed herein. It is intended that the specification and examples be considered as exemplary only, with a true scope and spirit being indicated by the following claims.

What is claimed is:

1. A method for tracking and reporting estimated vitamin D dosage from direct exposure to sunlight, the method comprising:
   receiving, by a processor of a device, a plurality of data values derived from an acquired signal of a thin-film or photodiode sensor assembly having sensitivity to ultraviolet B intensity of sunlight, wherein the acquired signal is associated with an instantaneous measure of ultraviolet B radiation exposure or intensity, wherein an electric output of the thin-film or photodiode sensor assembly is converted to the plurality of data values;
   determining, by the processor, an index parameter in an ultraviolet index tier using the plurality of data values in (i) a comparison operation of the data value to values of the ultraviolet index tier or (ii) a lookup operation of the data value to the index parameter;
   accumulating, by the processor, in a memory of the device, for a pre-defined period of time, the plurality of data values;
   determining, by the processor, a value of estimated Vitamin D dosage for the pre-defined period of time based on the accumulated data values associated with the pre-defined period of time; and
   presenting, via a display, upon direction of the processor, (i) a first graphical representation of a first parameter value associated with estimated dosage value of Vitamin D or an estimated remaining amount value of Vitamin D dosage required, wherein the first parameter value is derived from the estimated vitamin D dosage for the pre-defined period of time, and (ii) a second graphical representation of the index parameter value associated with the ultraviolet index tier.

2. The method of claim 1, wherein the first parameter value is an estimated dosage value of Vitamin D obtained over a current day, over a current week, or over a user-defined period.

3. The method of claim 2, wherein the estimated dosage value of Vitamin D obtained over the current day, over the current week, or over the user-defined period is determined by a computing operation that scales and/or offsets the accumulated data values associated with the pre-defined period of time with a set of pre-defined values.

4. The method of claim 3, wherein the first parameter value is associated with an estimated remaining amount value of Vitamin D dosage required or recommended for a current day, for a current week, or for over a user-defined period.

5. The method of claim 4, wherein the estimated remaining amount value of Vitamin D dosage required or recommended for the current day, for the current week, or for over the user-defined period is determined.

6. The method of claim 3, further comprising:
   determining, by the processor, a third parameter value associated with a recommended exposure time to direct sunlight based on a set of user-defined parameters.

7. The method of claim 5, wherein the set of user-defined parameters comprises a first user-defined parameter associated with a user skin type or user skin sensitivity.

8. The method of claim 5, wherein the set of user-defined parameters comprises a second user-defined parameter associated with a degree of area of exposed body surface area.

9. The method of claim 5, wherein the set of user-defined parameters comprises a third user-defined parameter selected from the group consisting of age, Vitamin D deficiency condition, and diagnosed disorder.

10. The method of claim 3, further comprising:
presenting, via the display, upon direction of the processor, a graphical representation of a third parameter, and/or a visual cue, associated with a current UV exposure index, wherein the graphical representation of the third parameter, and/or the visual cue, indicate a current safe exposure to the direct sunlight or indicate a current harmful exposure to the direct sunlight.

11. The method of claim 10, wherein the current UV exposure index is determined by:
i) comparing a parameter value derived from a last set of data values of the plurality of data values received by the processor from the thin-film or photodiode sensor assembly to one or more UV threshold values, wherein at least one of the one or more UV threshold values is associated with the current safe exposure to the direct sunlight or the current harmful exposure to the direct sunlight; or
ii) comparing a currently acquired signal of the thin-film or photodiode sensor assembly to one or more UV threshold signal levels, wherein at least one of the one or more UV threshold signal levels is associated with the current safe exposure to the direct sunlight or the current harmful exposure to the direct sunlight.

12. The method of claim 3, the thin-film or photodiode sensor assembly having further sensitivity to ultraviolet A intensity of sunlight and is selected from the group consisting of a SiC-based photodiode, a GaN-based photodiode, an InGaN photodiode, an AlGaN photodiode; a $PbTiO_3$-based photodiode, a $BaTiO_3$-based photodiode, a $SrTiO_3$-based photodiode, a $Ba_xSr_{1-x}TiO_3$-based photodiode, a $(1-x)BaTiO_3$-$(x)BiFeO_3$-based photodiode, a $PbZr_{1-x}Ti_xO_3$-based photodiode, a $(Pb_{1-y}La_y)(Zr_xTi_{1-x})O_3$-based photodiode wherein $0 \leq x \leq 1$ (such as 0.5) and $0 \leq y \leq 0.1$ such as (0.05), a $KNbO_3$-based photodiode, a ZnO-based photodiode, a MgZnS-based photodiodes, a $LaAlO_3$-based photodiode, and a ZnMgO-based photodiode.

13. The method of claim 3, wherein the device is a hand-held system, a wearable system, or a component of, or a set of components in, a mobile electronic device.

14. The method of claim 3, wherein the thin-film or photodiode sensor assembly comprises a PLZT thin-film $(Pb_{0.95}La_{0.05}Zr_{0.54}Ti_{0.46}O_3)$ photodiode.

15. The method of claim 1, comprising:
transmitting, by the processor, to a remote computing device, one or more device parameters values associated with i) the determined value of estimated Vitamin D dosage for the pre-defined period of time, ii) the accumulated data values associated with the pre-defined period of time, or iii) the presented parameter value associated with the obtained dosage of Vitamin D from the exposure to direct sunlight over the course of the pre-defined period of time.

16. An apparatus for tracking and reporting estimated vitamin D dosage from direct exposure to sunlight, the apparatus comprising:
a processor; and
a memory having instructions stored thereon, wherein the instructions when executed by the processor, cause the processor to:
receive a plurality of data values derived from an acquired signal of a thin-film or photodiode sensor assembly having sensitivity to ultraviolet B radiation of sunlight, wherein the acquired signal is associated with an instantaneous measure of ultraviolet B radiation exposure or intensity, wherein an electric output of the thin-film or photodiode sensor assembly is converted to the plurality of data values;
determine an index parameter in an ultraviolet index tier using the plurality of data values in (i) a comparison operation of the data value to values of the ultraviolet index tier or (ii) a lookup operation of the data value to the index parameter;
accumulate, for a pre-defined period of time, the plurality of data values;
determine a value of estimated Vitamin D dosage for the pre-defined period of time based on the accumulated data values associated with the pre-defined period of time; and
cause (i) a first graphical representation of a first parameter value associated with obtained dosage of Vitamin D from exposure to direct sunlight over the course of the pre-defined period of time, wherein the first parameter value is derived from the estimated vitamin D dosage for the pre-defined period of time, and (ii) a second graphical representation of a second parameter value associated with the ultraviolet index tier.

17. The apparatus of claim 16, further comprising:
a housing having a display coupled thereto, the housing forming a wearable device or hand-held system.

18. The apparatus of claim 16, further comprising:
a housing and an attachment member, collectively having a form of a watch, a hat, a headpiece, a neck piece, a neck band, a bracelet, a ring, an eye piece, an arm band.

19. The apparatus of claim 16, wherein the instructions when executed by the processor, further cause the processor to:
determine a third parameter value associated with recommended exposure time to direct sunlight based on a set of user-defined parameters.

20. The apparatus of claim 16, wherein the instructions when executed by the processor, further cause the processor to:
compare a parameter value, derived from a last set of data values of the plurality of data values received by the processor from the thin-film or photodiode sensor assembly, to one or more UV threshold values, wherein at least one of the one or more UV threshold values is associated with a current safe exposure to the direct sunlight or a current harmful exposure to the direct sunlight; and
present one or more graphical representations of a third parameter, and/or a visual cue, associated with a current UV exposure index, wherein the graphical representation of the third parameter, and/or the visual cue, indicate the current safe exposure to the direct sunlight or the current harmful exposure to the direct sunlight.

21. The method of claim 1, wherein the thin-film or photodiode sensor assembly is also sensitive to ultraviolet A intensity of sunlight.

* * * * *